(12) United States Patent
Shimoyama et al.

(10) Patent No.: US 10,619,265 B2
(45) Date of Patent: Apr. 14, 2020

(54) PLATING APPARATUS AND PLATING METHOD

(71) Applicant: EBARA CORPORATION, Tokyo (JP)

(72) Inventors: Masashi Shimoyama, Tokyo (JP); Takashi Kishi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/446,560

(22) Filed: Mar. 1, 2017

(65) Prior Publication Data

US 2017/0253987 A1  Sep. 7, 2017

(30) Foreign Application Priority Data

Mar. 3, 2016 (JP) ................. 2016-040801

(51) Int. Cl.
*C25D 17/00* (2006.01)
*H01L 21/67* (2006.01)
(Continued)

(52) U.S. Cl.
CPC .......... *C25D 17/001* (2013.01); *B08B 7/0057* (2013.01); *C25D 5/022* (2013.01);
(Continued)

(58) Field of Classification Search
CPC ...... C25D 17/001; C25D 5/022; C25D 7/123; C25D 17/00; C25D 17/06; C25D 17/004; C25D 13/22; B08B 7/0057; H01L 21/02068; H01L 21/67057; H01L 21/67115; H01L 21/6723; H01L 21/76873; H01L 21/76861; H01L 21/76862; H01L 21/02063; H01L 21/67207;
(Continued)

(56) References Cited

U.S. PATENT DOCUMENTS 4,883,575 A * 11/1989 Yasuno ................. C25D 13/22
 204/198
2004/0118697 A1 * 6/2004 Wen+ ..................... C23C 14/58
 205/215
(Continued)

FOREIGN PATENT DOCUMENTS

CN 100453698 C 1/2009
JP H05-315339 A 11/1993
(Continued)

*Primary Examiner* — Xiuyu Tai
(74) *Attorney, Agent, or Firm* — BakerHostetler

(57) ABSTRACT

The present invention improves the hydrophilicity of a substrate surface, and suppresses variation in the degree of hydrophilicity with each substrate. A plating apparatus is provided that performs a plating process on a substrate having a resist pattern. This plating apparatus includes a pretreatment bath that performs hydrophilic treatment by bringing a pretreatment liquid into contact with a surface to be plated of the substrate, and a plating bath that performs a plating process on a substrate that has undergone the hydrophilic treatment. The pretreatment bath includes a pretreatment liquid supplying device that supplies the pretreatment liquid into the pretreatment bath, and an ultraviolet light irradiation device that irradiates ultraviolet light onto the surface to be plated of the substrate.

16 Claims, 16 Drawing Sheets

(51) Int. Cl.
*C25D 5/02* (2006.01)
*B08B 7/00* (2006.01)
*C25D 7/12* (2006.01)
*C25D 17/06* (2006.01)
*H01L 21/02* (2006.01)

(52) U.S. Cl.
CPC ............ *C25D 7/123* (2013.01); *C25D 17/00* (2013.01); *C25D 17/06* (2013.01); *H01L 21/02068* (2013.01); *H01L 21/6723* (2013.01); *H01L 21/67057* (2013.01); *H01L 21/67115* (2013.01); *C25D 17/004* (2013.01)

(58) Field of Classification Search
CPC ............ C23C 18/1865; C23C 18/1619; C23C 18/1632; C23C 18/1653; C23C 18/1851; C23C 18/1868; C23C 18/2006; C23C 18/204; H01J 37/32357; H05K 3/0091; H05K 2203/135; H05K 2203/1518
See application file for complete search history.

(56) References Cited

U.S. PATENT DOCUMENTS

| | | | |
|---|---|---|---|
| 2006/0108232 A1* | 5/2006 | Hiraoka | C23C 18/1653 205/167 |
| 2010/0320081 A1* | 12/2010 | Mayer | H01L 21/2885 204/242 |
| 2014/0256127 A1* | 9/2014 | Spurlin | H01L 21/76873 438/643 |

FOREIGN PATENT DOCUMENTS

| | | |
|---|---|---|
| JP | 2005-240108 A | 9/2005 |
| JP | 2012-114256 A | 6/2012 |

\* cited by examiner

PLATING APPARATUS AND PLATING METHOD

TECHNICAL FIELD

This application claims the priority and benefit of Japanese Patent Application No. 2016-040801, filed on Mar. 3, 2016, the disclosure of which is incorporated by reference herein in its entirety.

The present invention relates to a plating apparatus and a plating method.

BACKGROUND ART

Conventionally, wiring is formed in micro wiring grooves, holes, and resist openings provided in a surface of a semiconductor wafer or the like, and a bump (a protruding electrode) that electrically connects to an electrode of a package or the like is formed on the surface of the semiconductor wafer or the like. Examples of known methods for forming the wiring and bumps include an electrolytic plating method, a deposition method, a printing method, and a ball bump method, but the electrolytic plating method, with which performance is relatively stable and miniaturization is possible, is increasingly being used with an increase in the number of I/Os, and a reduction of the pitch between the I/Os, of semiconductor chips.

When forming a bump by the electrolytic plating method in a predetermined position on a substrate on which wiring is formed, a resist is generally used as a mask. That is, a seed layer is formed as a power supply layer on a surface of the substrate, and a resist having a height of 20 to 120 µm, for example, is applied to the entire surface of this seed layer. Then, an opening having a diameter of approximately 5 to 200 µm, for example, is provided in a predetermined position in this resist layer, and a resist pattern is formed. Then, an ashing process is performed to remove resist residue on the substrate by irradiating ultra violet (UV) light onto the substrate on which the resist pattern has been formed (see Japanese Patent Laid-Open No. 5-315339, for example). When the ashing process is performed, organic matter adhered to the seed layer of the substrate is removed, and the resist surface also becomes hydrophilic. Hydrophilic treatment (descum process) is also sometimes performed to improve the wettability of the surface to be plated by irradiating $O_2$ plasma onto the resist surface of the substrate (see Japanese Patent Laid-Open No. 2012-114256, for example). A plating apparatus that includes an ashing device that ashes the resist surface of the substrate is also known (see Japanese Patent Laid-Open No. 2005-240108).

CITATION LIST

Patent Document

Patent Document 1: Japanese Patent Laid-Open No. H05-315339
Patent Document 2: Japanese Patent Laid-Open No. 2012-114256
Patent Document 3: Japanese Patent Laid-Open No. 2005-240108

SUMMARY OF INVENTION

Technical Problem

In a conventional plating method, a plating process is not necessarily performed immediately after the ashing process or the descum process is performed. That is, the amount of time before plating is performed after the ashing process or the descum process is performed differs depending on the conditions of that process. As time passes after the ashing process or the descum process is performed, organic matter adheres to the seed layer of the substrate and the resist surface, and the surface to be plated and the resist surface change from being hydrophilic to being hydrophobic.

If plating is performed on the substrate after an extended period of time has passed after the ashing process or the descum process is performed, pretreatment liquid will not enter the resist pattern of the substrate having the hydrophobic surface, and air bubbles will be adsorbed on the surface to be plated of the substrate and will be difficult to remove. Therefore, defects may occur in the plated substrate.

With the plating apparatus described in Japanese Patent Laid-Open No. 2005-240108, the resist surface is made hydrophilic by the ashing device before a pre-wet treatment is performed. However, with this plating apparatus, the ashing device and a pre-wet bath are arranged separately. Ashing is performed on the substrate before the substrate is held by a substrate holder, and the pre-wet treatment is performed on the substrate that is being held by the substrate holder. Therefore, depending on the plating process situation, the substrate may not be able to be transported quickly, so the pre-wet treatment may not be able to be performed immediately after ashing is performed. Therefore, the period of time between the ashing process and the pre-wet treatment may be different with each substrate. As a result, the degree of hydrophilicity may vary with each substrate.

The present invention is made in view of the foregoing problems. It is an object of the present invention to improve the hydrophilicity of the substrate surface, and suppress variation in the degree of hydrophilicity with each substrate.

Solution to Problem

According to one aspect of the present invention, a plating apparatus is provided that performs a plating process on a substrate having a resist pattern. This plating apparatus includes a pretreatment bath that performs hydrophilic treatment by bringing a pretreatment liquid into contact with a surface to be plated of the substrate, and a plating bath that performs a plating process on a substrate that has undergone the hydrophilic treatment. The pretreatment bath includes a pretreatment liquid supplying device that supplies the pretreatment liquid into the pretreatment bath, and an ultraviolet light irradiation device that irradiates ultraviolet light onto the surface to be plated of the substrate.

According to this aspect, the substrate surface is able to be cleaned and reformed by irradiating the substrate with ultraviolet light in the pretreatment bath. As a result, the substrate surface is made hydrophilic. Also, the pretreatment liquid can be brought into contact with the surface to be plated of the substrate by the pretreatment liquid supplying device, without transporting the substrate from the pretreatment bath to another device, or the like. That is, the ultraviolet light irradiation and the hydrophilic treatment are able to be performed in the pretreatment bath, without moving the substrate from the pretreatment bath. Therefore, hydrophilic treatment (pre-wet treatment) can be performed immediately after, or at the same time as, the cleaning and reforming by ultraviolet light irradiation are performed, so the period of time after the substrate surface is cleaned and reformed until the hydrophilic treatment is performed is able to be extremely short, and the period of time after the cleaning and reforming by ultraviolet light irradiation until the hydrophilic treatment is able to be made constant for each substrate. Consequently, the hydrophilicity of the substrate surface is able to be improved, and variation in the degree of hydrophilicity with each substrate is able to be suppressed. Also, the cleaning and reforming of the substrate and the hydrophilic treatment are able to be performed at the same time and in the same location (the same device), so the throughput of the plating apparatus is able to be improved, and the footprint of the apparatus is able to be reduced.

In an aspect of the present invention, the plating apparatus includes a control portion that controls the pretreatment liquid supplying device and the ultraviolet light irradiation device. The control portion controls the ultraviolet light irradiation device and the pretreatment liquid supplying device so as to bring the pretreatment liquid into contact with the substrate after starting the irradiation of ultraviolet light onto the substrate.

According to this aspect, ultraviolet light irradiation onto the substrate is performed first, and then the pretreatment liquid is brought into contact with the substrate. As a result, ultraviolet light is prevented from being absorbed by the pretreatment liquid, so the substrate can be efficiently cleaned and reformed.

In an aspect of the present invention, the plating apparatus includes a control portion that controls the pretreatment liquid supplying device and the ultraviolet light irradiation device. The control portion controls the ultraviolet light irradiation device and the pretreatment liquid supplying device such that the irradiation of ultraviolet light onto the substrate and the contact of the pretreatment liquid with the substrate are performed at least partially simultaneously.

According to this aspect, the ultraviolet light irradiation onto the substrate and the contact of the pretreatment liquid with the substrate are performed at least partially simultaneously, so ultraviolet light is also irradiated onto the pretreatment liquid, which enables the pretreatment liquid to be sterilized. Therefore, this pretreatment liquid is able to be used repeatedly for a longer period of time, so the running cost of the plating apparatus is able to be reduced.

In an aspect of the present invention, the ultraviolet light irradiation device is configured to irradiate ultraviolet light onto the surface to be plated of the substrate in an air atmosphere or a vacuum atmosphere.

Performing ultraviolet light irradiation in an ozone atmosphere when ashing a resist of the substrate surface is conventionally known. When performing ultraviolet light irradiation in an ozone atmosphere in this way, the resist is incinerated by active oxygen that has separated from the ozone. According to this aspect, ultraviolet light irradiation is performed in an air atmosphere or a vacuum atmosphere, so the substrate surface is able to be cleaned and reformed while preventing active oxygen of an amount that would incinerate the resist of the substrate from being produced.

In an aspect of the present invention, the plating apparatus includes a lid that seals the pretreatment bath, and an evacuation device that evacuates air from within the pretreatment bath. The control portion is configured to control the evacuation device and the pretreatment liquid supplying device so as to bring the pretreatment liquid into contact with the surface to be plated of the substrate in the vacuum atmosphere.

According to this aspect, the inside of the pretreatment bath is able to be made a vacuum atmosphere, and the pretreatment liquid is able to be brought into contact with the surface to be plated of the substrate. As a result, the pretreatment liquid is more easily able to enter the opening in the resist pattern on the substrate, so the substrate surface is able to be suitably hydrophilically treated.

In an aspect of the present invention, the plating apparatus includes an evacuation device that evacuates air from within the pretreatment bath, and a substrate holder that holds the substrate such that the surface to be plated of the substrate is exposed. The substrate holder has a sealing surface that is provided on a side where the surface to be plated of the substrate is exposed and that seals an opening of the pretreatment bath, and a seal member that seals between a peripheral edge portion of the substrate and the sealing surface. In a state in which the substrate holder seals the opening of the pretreatment bath, the surface to be plated of the substrate is exposed inside the pretreatment bath. Also, the control portion controls the evacuation device to evacuate air from within the pretreatment bath in the state in which the substrate holder seals the opening of the pretreatment bath.

According to this aspect, the substrate holder serves as a lid that seals the opening of the pretreatment bath. Therefore, a lid for sealing the opening of the pretreatment bath does not need to be prepared, so the cost of the plating apparatus is able to be reduced. Also, when the lid of the opening of the pretreatment bath is provided separately from the substrate holder, the placing of the substrate holder in the pretreatment bath and the opening and closing of the lid must be performed separately. In contrast, with this aspect, the opening of the pretreatment bath is able to be opened and closed by the substrate holder, so transport of the substrate holder and opening and closing of the opening of the pretreatment bath are able to be performed simultaneously. Therefore, the number of procedures for pretreating the substrate is able to be reduced, and as a result, the time required for pretreatment is able to be shortened.

In an aspect of the present invention, in the state in which the substrate holder seals the opening of the pretreatment bath, the substrate holder is arranged at the opening of the pretreatment bath such that the substrate is inclined with respect to horizontal.

According to this aspect, when the pretreatment liquid is filled in the pretreatment bath by the pretreatment liquid supplying device, the pretreatment liquid will easily enter the opening of the resist pattern on the substrate due to the inclination of the substrate, so air is able to be inhibited from remaining on the substrate surface.

In an aspect of the present invention, the substrate is held by the substrate holder such that the surface to be plated is exposed. The plating apparatus further includes a cover that is arranged inside the pretreatment bath and is configured to contact the substrate holder and hermetically cover the substrate, and an evacuation device that evacuates air from within the cover. The ultraviolet light irradiation device is provided on the cover. The pretreatment liquid supply device is configured to supply the pretreatment liquid into the cover.

According to this aspect, the evacuation device need only evacuate air only from within the cover, and the pretreatment liquid supplying device need only supply the pretreatment liquid only into the cover. Therefore, the evacuation time and the pretreatment liquid supply time are able to be shorter than they are when air is evacuated from the pretreatment bath and the pretreatment bath is filled with pretreatment liquid.

According to an aspect of the present invention, a plating method is provided. This plating method includes a step of arranging a substrate having a resist pattern in a pretreatment bath; a cleaning and reforming step of cleaning and reforming a surface of the substrate by irradiating ultraviolet light onto a surface to be plated of the substrate, inside the pretreatment bath; a hydrophilic step of hydrophilically treating the substrate surface by bringing the pretreatment liquid into contact with the surface to be plated of the substrate, inside the pretreatment bath; and a plating step of performing a plating process on the substrate a surface of which has undergone the cleaning and reforming and the hydrophilic treatment.

According to this aspect, the substrate surface is able to be cleaned and reformed by irradiating ultraviolet light onto the substrate that has been placed in the pretreatment bath. As a result, the substrate surface is made hydrophilic. Also, the pretreatment liquid can be brought into contact with the surface to be plated of the substrate by the pretreatment liquid supplying device, without transporting the substrate out of the pretreatment bath, or the like. That is, the ultraviolet light irradiation and the hydrophilic treatment are able to be performed in the pretreatment bath, without moving the substrate from the pretreatment bath. Therefore, hydrophilic treatment (pre-wet treatment) can be performed immediately after, or at the same time as, the cleaning and reforming by ultraviolet light irradiation are performed. As a result, the period of time after the substrate surface is cleaned and reformed until the hydrophilic treatment is performed is able to be extremely short, and the period of time after the cleaning and reforming by ultraviolet light irradiation until the hydrophilic treatment is able to be made constant for each substrate. Consequently, the hydrophilicity of the substrate surface is able to be improved, and variation in the degree of hydrophilicity with each substrate is able to be suppressed.

In an aspect of the present invention, the plating method is such the hydrophilic step is executed without removing the substrate from the pretreatment bath after the cleaning and reforming step has started.

According to this aspect, ultraviolet light irradiation onto the substrate is performed first, and then the pretreatment liquid is brought into contact with the substrate. As a result, ultraviolet light is prevented from being absorbed by the pretreatment liquid, so the substrate can be efficiently cleaned and reformed. Also, the hydrophilic step is performed without removing the substrate from the pretreatment bath after ultraviolet light irradiation onto the substrate has started, so the time after the substrate surface is cleaned and reformed until hydrophilic treatment is performed is able to be made extremely short.

In an aspect of the present invention, the cleaning and reforming step and the hydrophilic step are executed at least partially simultaneously.

According to this aspect, the ultraviolet light irradiation onto the substrate and the contact of the pretreatment liquid with the substrate are performed at least partially simultaneously, so ultraviolet light is also irradiated onto the pretreatment liquid, which enables the pretreatment liquid to be sterilized. Therefore, this pretreatment liquid is able to be used repeatedly for a longer period of time, so the running cost of the plating process is able to be reduced.

In an aspect of the present invention, the cleaning and reforming step includes a step of irradiating ultraviolet light onto the surface to be plated of the substrate in an air atmosphere or a vacuum atmosphere.

Performing ultraviolet light irradiation in an ozone atmosphere when ashing a resist of the substrate surface is conventionally known. When performing ultraviolet light irradiation in an ozone atmosphere in this way, the resist may be incinerated by active oxygen that has separated from the ozone. According to this aspect, ultraviolet light irradiation is performed in an air atmosphere or a vacuum atmosphere, so the substrate surface is able to be cleaned and reformed while preventing active oxygen of an amount that would incinerate the resist of the substrate from being produced.

In an aspect of the present invention, the plating method includes a step of sealing the pretreatment bath after the substrate is arranged in the pretreatment bath, and a step of evacuating air from within the pretreatment bath after the pretreatment bath is sealed. The hydrophilic step includes a step of bringing the pretreatment liquid into contact with the surface to be plated of the substrate in the vacuum atmosphere.

According to this aspect, the inside of the pretreatment bath is able to be made a vacuum atmosphere, and the pretreatment liquid is able to be brought into contact with the surface to be plated of the substrate. As a result, the pretreatment liquid is more easily able to enter the opening in the resist pattern on the substrate, so the substrate surface is able to be suitably hydrophilically treated.

In an aspect of the present invention, the plating method includes a step of holding the substrate with a substrate holder such that a peripheral edge portion of the substrate is sealed, and the surface to be plated of the substrate is exposed. The hydrophilic step includes a step of immersing the substrate in the pretreatment liquid such that the surface to be plated of the substrate is immersed in the pretreatment liquid, and a space inside the substrate holder is communicated with a space outside of the pretreatment liquid.

According to this aspect, the substrate is held by the substrate holder in a state in which the peripheral edge portion of the substrate is sealed. When differential pressure occurs between the inside of the substrate holder and the outside of the substrate holder when the pretreatment bath in which this substrate holder has been placed is given a vacuum atmosphere, the substrate may bend backward. Therefore, the space inside the substrate holder is sometimes configured to be communicated with the space outside the substrate holder so that differential pressure does not occur between the inside and the outside of the substrate holder. When such a substrate holder is immersed in pretreatment liquid, the pretreatment liquid may enter the space inside the substrate holder. With this aspect, when the substrate held by the substrate holder is immersed in the pretreatment liquid, the space inside the substrate holder becomes communicated with a space outside of the pretreatment liquid, so the pretreatment liquid is able to be prevented from entering the space inside the substrate holder, while the substrate is prevented from bending in the vacuum atmosphere.

In an aspect of the present invention, the plating method includes a step of holding the substrate with a substrate holder such that the surface to be plated of the substrate is exposed; a sealing step of sealing an opening provided in the pretreatment bath with the substrate holder; and a step of evacuating air from within the pretreatment bath while the opening is sealed.

According to this aspect, the substrate holder serves as a lid that seals the opening of the pretreatment bath. Therefore, a lid for sealing the opening of the pretreatment bath does not need to be prepared, so the cost of the plating apparatus is able to be reduced. Also, when the lid of the opening of the pretreatment bath is provided separately from the substrate holder, the placing of the substrate holder in the pretreatment bath and the opening and closing of the lid must be performed separately. In contrast, with this aspect, the opening of the pretreatment bath is able to be opened and closed by the substrate holder, so transport of the substrate holder and opening and closing of the opening of the pretreatment bath are able to be performed simultaneously. Therefore, the number of procedures for pretreating the substrate is able to be reduced, and as a result, the time required for treatment is able to be shortened.

In an aspect of the present invention, the sealing step includes a step of arranging the substrate holder at the opening such that the substrate is inclined with respect to horizontal, and sealing the opening.

According to this aspect, when the pretreatment liquid is filled in the pretreatment bath by the pretreatment liquid supplying device, air is inhibited from remaining on the substrate surface due to the inclination of the substrate.

In an aspect of the present invention, the plating method includes a step of holding the substrate with a substrate holder such that the surface to be plated of the substrate is exposed; a step of bringing a cover into contact with the substrate holder so as to hermetically cover the substrate; and a step of evacuating air from within the cover. The cleaning and reforming step includes a step of cleaning and reforming a surface of the substrate by irradiating ultraviolet light onto the surface to be plated of the substrate inside the cover. The hydrophilic step includes a step of hydrophilically treating the substrate surface by bringing the pretreatment liquid into contact with the surface to be plated of the substrate, inside the cover.

According to this aspect, in the cleaning and reforming step, air need only be evacuated only from within the cover, and in the hydrophilic step, the pretreatment liquid need only be supplied only into the cover. Therefore, the evacuation time and the pretreatment liquid supply time are able to be shorter than they are when air is evacuated from the pretreatment bath and the pretreatment bath is filled with pretreatment liquid.

DESCRIPTION OF EMBODIMENTS

First Embodiment

Figure 1:
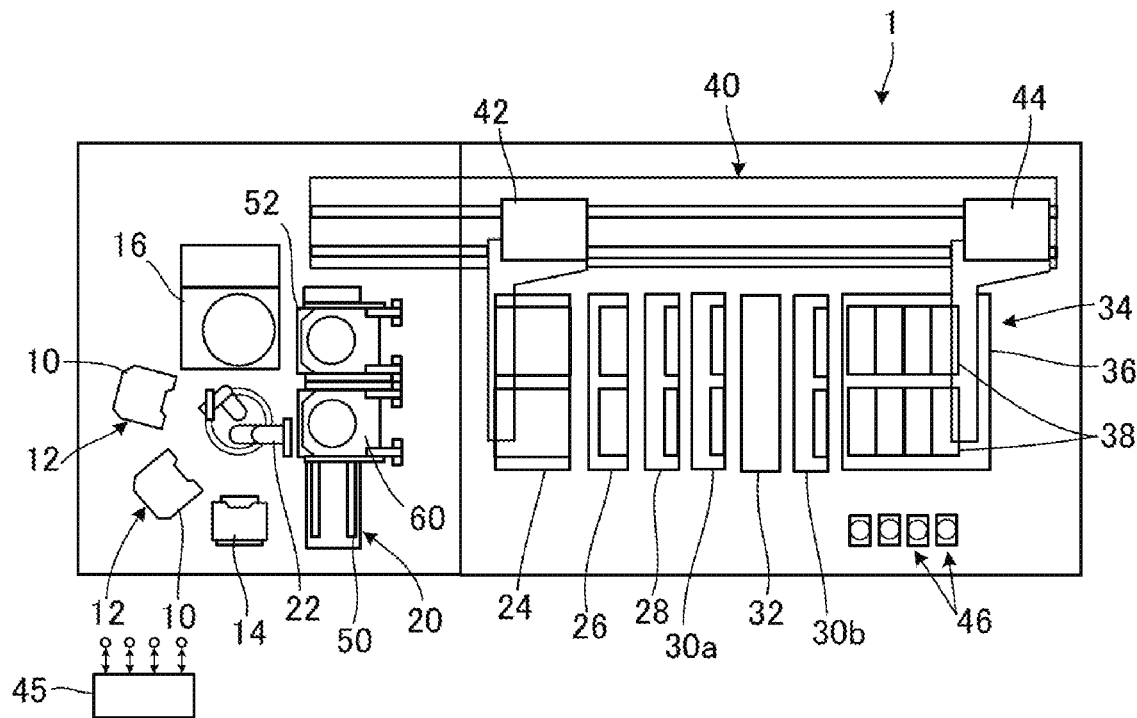
FIG. 1 is a general arrangement drawing of a plating apparatus according to the embodiment.

Hereinafter, a plating apparatus according to a first embodiment of the present invention will be described with reference to the accompanying drawings. In the drawings described below, like or corresponding constituent elements will be designated by the same reference characters, and redundant descriptions will be omitted.

FIG. 1 is a general arrangement drawing of a plating apparatus according to the embodiment. As shown in FIG. 1, this plating apparatus 1 includes two cassette tables 12 on which cassettes 10 within which substrates of semiconductor wafers or the like are stored are mounted, an aligner 14 that aligns the position of an orientation flat, a notch or the like of a substrate in a predetermined direction, a substrate attaching/detaching portion 20 that attaches and detaches a substrate with respect to a placed substrate holder 60, and a spin rinse dryer 16 that dries a substrate after a plating process by spinning the substrate at a high speed. A substrate transport device 22, e.g., a transporting robot that transports a substrate among these units is arranged in substantially the middle of these units.

The substrate attaching/detaching portion 20 has a flat plate-like placing plate 52 that is able to slide horizontally along a rail 50. In a state in which two of the substrate holders 60 are horizontally placed on the placing plates 52 in parallel, the substrate transport device 22 delivers a substrate to one of the substrate holders 60. Then, the substrate transport device 22 slides the placing plate 52 in the horizontal direction and delivers a substrate to the other of the substrate holders 60.

Also, the plating apparatus 1 has a stocker 24, a pre-wet bath 26 (which corresponds to one example of a pretreatment bath), a pre-soak bath 28, a first cleaning bath 30a, a blow bath 32, a second cleaning bath 30b, and a plating bath 34. The substrate holders 60 are stored and temporarily placed in the stocker 24. In the pre-wet bath 26, hydrophilic treatment is performed to improve the wettability of a surface to be plated of the substrate by bringing a pretreatment liquid (e.g., deionized water) into contact with the surface to be plated of the substrate. In the pre-soak bath 28, an oxidized film on the surface of a conductive layer such as a seed layer formed on the surface of the substrate is removed by etching. In the first cleaning bath 30a, the pre-soaked substrate is cleaned with a cleaning liquid (such as deionized water) together with the substrate holder 60. In the blow bath 32, the cleaned substrate is dried. In the second cleaning bath 30b, the plated substrate is cleaned with a cleaning liquid together with the substrate holder 60. The stocker 24, the pre-wet bath 26, the pre-soak bath 28, the first cleaning bath 30a, the blow bath 32, the second cleaning bath 30b, and the plating bath 34 are arranged in this order.

The plating bath 34 includes an overflow bath 36 and a plurality of plating units 38 housed inside the overflow bath 36. Each plating unit 38 houses the substrate holder 60 holding a substrate, and immerses the substrate in plating liquid held in the plating unit 38. In the plating unit 38, plating such as copper plating is performed on the substrate surface by applying a voltage between the substrate and an anode. The same plating apparatus 1 can also be used in the plating of nickel, solder, silver, or gold or the like, other than copper.

Furthermore, the plating apparatus 1 includes a substrate holder transport device 40 that transports the substrate holder 60. The substrate holder transport device 40 is a linear motor type substrate holder transport device, for example, which is positioned to the side of the substrate attaching/detaching portion 20 and the baths. The substrate holder transport device 40 has a first transporter 42 that transports the substrate between the substrate attaching/detaching portion 20 and the stocker 24, and a second transporter 44 that transports the substrate among the stocker 24, the pre-wet bath 26, the pre-soak bath 28, the cleaning baths 30a and 30b, the blow bath 32, and the plating bath 34. The substrate holder transport device 40 may also be provided with only the first transporter 42, and not be provided with the second transporter 44.

The plating apparatus 1 has a control portion 45 configured to control each portion of the plating apparatus 1. The control portion 45 has, for example, a memory within which a predetermined program is stored, a central processing unit (CPU) that executes the program stored in the memory, and the like. The control portion 45 is able to perform, for example, transport control of the substrate transport device 22, transport control of the substrate holder transport device 40, control of a plating current and plating time in the plating bath 34, and control of pretreatment in the pre-wet bath 26, which will be described later.

The treatment of the substrate in the plating apparatus 1 will now be described. First, the substrate transport device 22 removes a substrate from the cassette 10 and transports the substrate to the aligner 14. The aligner 14 aligns the orientation of a notch or orientation flat of the substrate. Next, the substrate is transported to the substrate attaching/detaching portion 20 by the substrate transport device 22, and held by the substrate holder 60. The substrate held by the substrate holder 60 is transported to the pre-wet bath 26 and pretreated. Then, the pretreated substrate is delivered to the pre-soak bath 28, and the oxidized film on the substrate surface is removed. The treatment in the pre-soak bath 28 is sometimes omitted. The substrate from which the oxidized film has been removed is then placed in the first cleaning bath 30a and cleaned together with the substrate holder 60.

Next, the substrate is placed in the plating bath 34 and plating is performed on the substrate surface. The plated substrate is then placed in the second cleaning bath 30b and cleaned together with the substrate holder 60. After the substrate is dried in the blow bath 32, the substrate is removed from the substrate holder 60 by the substrate attaching/detaching portion 20. The removed substrate is then cleaned and dried by the spin rinse dryer 16, and placed in the cassette 10.

Figure 2:
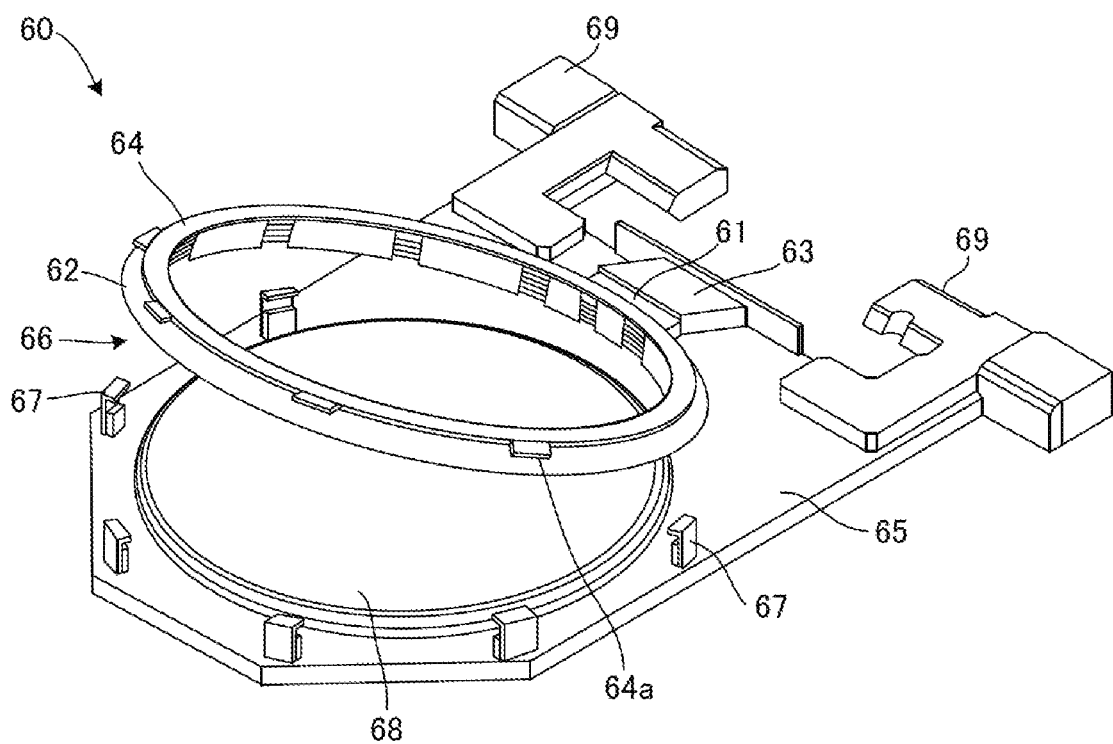
FIG. 2 is a perspective view of a substrate holder used with the plating apparatus shown in FIG. 1.

FIG. 2 is a perspective view of the substrate holder 60 used with the plating apparatus shown in FIG. 1. The substrate holder 60 has, for example, a first holding member 65 that is made of vinyl chloride and has a rectangular flat plate shape, and a second holding member 66 that is attached to the first holding member 65 in a manner able to open and close freely via a hinge 63, as shown in FIG. 2. A holding surface 68 for holding the substrate is provided in substantially the center of the first holding member 65 of the substrate holder 60. Also, clampers 67 that each have an inverted L-shape and a protruding portion that protrudes inward are provided at equally spaced intervals along the periphery of the holding surface 68 of the first holding member 65, to the outside of the holding surface 68.

A pair of hands 69, each of which is generally T-shaped, which serve as support portions when transporting or suspending and supporting the substrate holder 60, are connected to an end portion of the first holding member 65 of the substrate holder 60. The substrate holder 60 is vertically suspended and supported by hooking the hands 69 on a peripheral wall upper surface of the stocker 24, inside the stocker 24 shown in FIG. 1. Also, these hands 69 of the substrate holder 60 that is suspended and supported are gripped by the first transporter 42 or the second transporter 44, and the substrate holder 60 is transported. The substrate holder 60 is also suspended and supported inside, on the peripheral walls of, the pre-wet bath 26, the pre-soak bath 28, the cleaning baths 30a and 30b, the blow bath 32, and the plating bath 34, via the hands 69.

Also, an external contact, not shown, for connecting to an external power supply portion, is provided on the hands 69. This external contact is electrically connected to a plurality of conductors 73 (see FIG. 3) provided on an outer periphery of the holding surface 68 via a plurality of wires.

The second holding member 66 includes a proximal portion 61 that is fixed to the hinge 63, and a seal holder 62 that has a ring shape and is fixed to the proximal portion 61. A pressure ring 64 for pressing and fixing the seal holder 62 to the first holding member 65 is rotatably attached to the seal holder 62 of the second holding member 66. The pressure ring 64 has a plurality of protruding portions 64a that protrude outward on an outer peripheral portion. Upper surfaces of the protruding portions 64a and lower surfaces of inwardly protruding portions of the clampers 67 have tapered surfaces that are inclined in opposite directions along the rotational direction.

When holding the substrate, the substrate is first placed on the holding surface 68 of the first holding member 65 while the second holding member 66 is open, and then the second holding member 66 is closed. Next, the pressure ring 64 is rotated clockwise, and the protruding portions 64a of the pressure ring 64 are slid inside (under) the inwardly protruding portions of the clampers 67. As a result, the first holding member 65 and the second holding member 66 are clamped and locked together via the tapered surfaces provided on each of the pressure ring 64 and the clampers 67, such that the substrate is held. The surface to be plated of the held substrate is exposed to the outside. When releasing the hold on the substrate, in a state in which the first holding member 65 and the second holding member 66 are locked, the pressure ring 64 is rotated counterclockwise. As a result, the protruding portions 64a of the pressure ring 64 come away from the clampers 67 that have an inverted L-shape, and the hold on the substrate is released.

Figure 3:
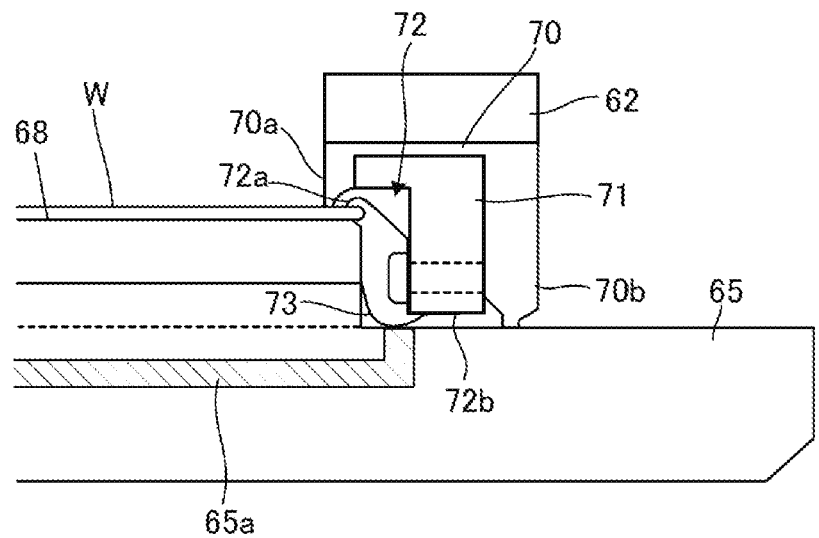
FIG. 3 is a sectional view of an electrical contact of the substrate holder shown in FIG. 2.

FIG. 3 is a sectional view of an electrical contact of the substrate holder 60 shown in FIG. 2. In the example shown in FIG. 3, a substrate W is placed on the holding surface 68 of the first holding member 65. The plurality (one in the drawing) of conductors 73 that are connected to the plurality of wires extending from the external contact provided on the hands 69 shown in FIG. 2, are arranged between the holding surface 68 and the first holding member 65. Each of the plurality of the conductors 73 is arranged to the circumferential outside of the substrate W, when the substrate W has been placed on the holding surface 68 of the first holding member 65, such that end portion of the conductor 73 is exposed in a state having a spring characteristic on the surface of the first holding member 65 on the side of the substrate W.

A seal member 70 that is pressed against the surface outer peripheral portion of the substrate W and the first holding member 65 when the substrate W is held by the substrate holder 60, is attached to the surface (the lower surface in the drawing) of the seal holder 62 that faces the first holding member 65. The seal member 70 has a lip portion 70a that seals against the surface of the substrate W, and a lip portion 70b that seals against the surface of the first holding member 65. That is, the seal member 70 is configured to seal between the peripheral edge portion of the substrate and the surface of the first holding member 65.

A support 71 is attached to an inside portion of the seal member 70 that is sandwiched by a pair of lip portions 70a and 70b. A plurality of electrical contacts 72 that are configured to be able to supply power from the conductor 73 are fixed by screws or the like, for example, to the support 71, and are arranged along the circumference of the substrate W. Each of the electrical contacts 72 has an electrical contact end portion 72a that extends toward the inside of the holding surface 68, and a leg portion 72b configured to be able to supply power from the conductor 73.

When the first holding member 65 and the second holding member 66 shown in FIG. 2 are locked, the short lip portion 70a on the inner peripheral surface side of the seal member 70 is pressed against the surface of the substrate W, and the long lip portion 70b on the outer peripheral surface side of the seal member 70 is pressed against the surface of the first holding member 65, respectively. As a result, the space between the lip portion 70a and the lip portion 70b is reliably sealed, and the substrate W is held.

In the region sealed by the seal member 70, i.e., in the region sandwiched by the pair of lip portions 70a and 70b of the seal member 70, the conductor 73 is electrically connected to the leg portion 72b of the electrical contact 72, and the electrical contact end portion 72a contacts the seed layer on the edge portion of the substrate W. As a result, power is able to be supplied to the substrate W via the electrical contact 72 while the substrate W is in a state sealed by the seal member 70 and held by the substrate holder 60.

A communication hole 65a that communicates with the outside of the substrate holder 60 is formed in the first holding member 65 in the region sealed by the seal member 70. The communication hole 65a extends to a position near the hands 69 of the first holding member 65, for example, and communicates the space sealed by the seal member 70, i.e., the space inside the substrate holder 60, with a space outside the substrate holder 60. As will be described later, when pretreating the substrate W, the substrate holder 60 is sometimes placed in a vacuum atmosphere (see the second, third, and fourth embodiments). If differential pressure occurs between the space inside the substrate holder 60 and the space outside the substrate holder 60, the substrate W may bend. Therefore, by providing the communication hole 65a in the substrate holder 60, the space inside the substrate holder 60 is communicated with the space outside the substrate holder 60, so differential pressure between these spaces will be eliminated. If the substrate holder is not placed in a vacuum atmosphere, this communication hole 65a may be omitted.

As described above, a resist pattern is formed in advance on the substrate W on which the seed layer is formed. Resist residue on the substrate surface is removed by performing UV irradiation or the like (ashing process), or hydrophilic treatment of the surface to be plated is performed by irradiating $O_2$ plasma onto the resist surface of the substrate W (descum process), before the substrate W is transported to the plating apparatus 1 shown in FIG. 1. The substrate W that has undergone the ashing process or the descum process is then transported to the plating apparatus 1 and held by the substrate holder 60. Here, organic matter adheres to the surface to be plated of the substrate W as time passes after the ashing process or the descum process, so the surface to be plated and the resist surface change from being hydrophilic to being hydrophobic. Therefore, with the plating apparatus 1 according to the embodiment, the hydrophilicity of the surface of the substrate W is improved and the degree of hydrophilicity for each substrate is made uniform by cleaning and reforming the surface of the substrate W that has been transported to the plating apparatus 1, right before, or simultaneously with, the pretreatment (pre-wet treatment) of the substrate W. Hereinafter, the pretreatment performed on the substrate W in the pre-wet bath 26 shown in FIG. 1 will be described in detail.

Figure 4A:
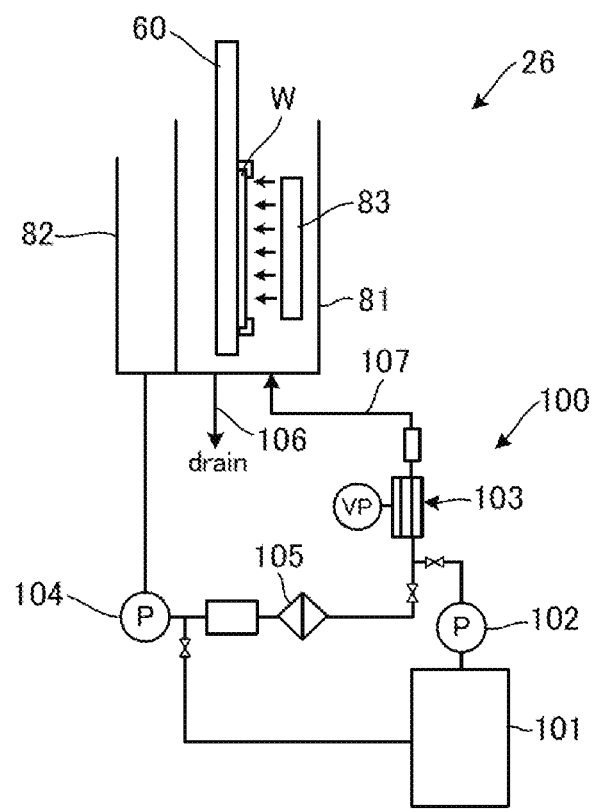
FIG. 4A is a schematic side view of a pre-wet bath in a state in which a substrate surface is being cleaned and reformed.
Figure 4B:
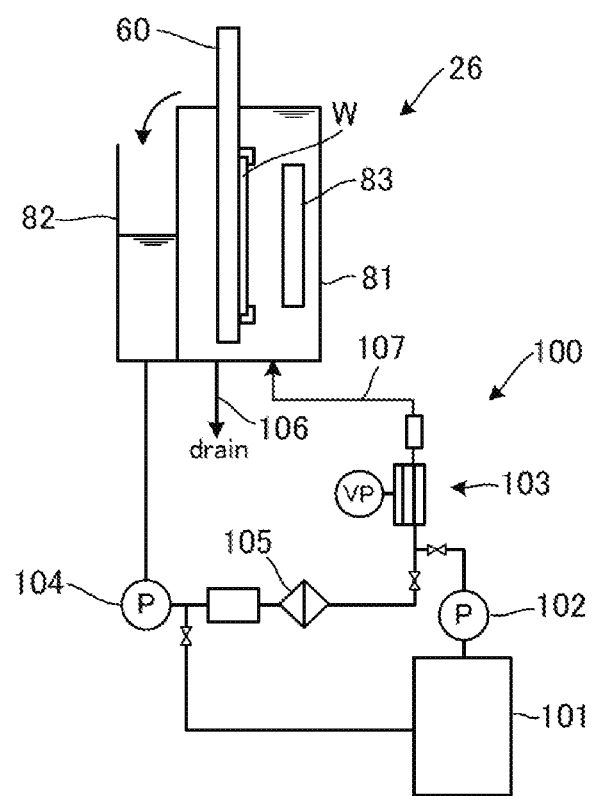
FIG. 4B is a schematic side view of the pre-wet bath in a state in which a substrate surface is being hydrophilically treated.
Figure 5:
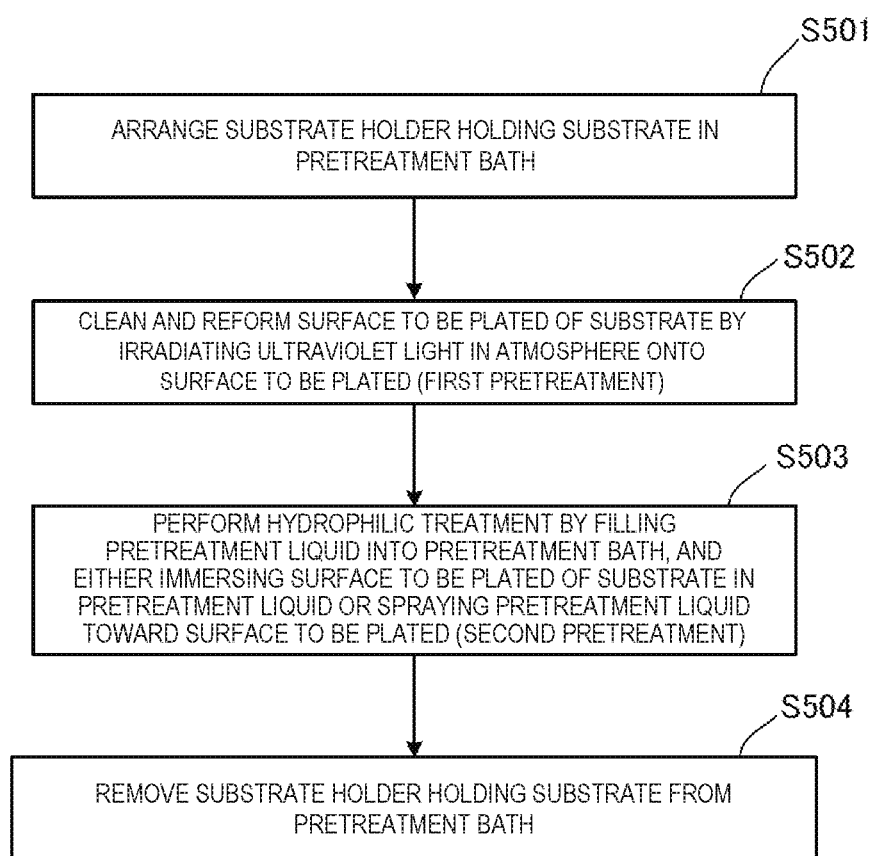
FIG. 5 is a flowchart illustrating pretreatment performed on the substrate in the pre-wet bath shown in FIGS. 4A, 4B, and 4C.

FIGS. 4A and 4B are schematic side views of the pre-wet bath 26 according to a first embodiment. More specifically, FIG. 4A is a schematic side view of the pre-wet bath 26 in a state in which the surface of the substrate W is being cleaned and reformed, and FIG. 4B is a schematic side view of the pre-wet bath 26 in a state in which the surface of the substrate W is being hydrophilically treated. Also, FIG. 5 is a flowchart illustrating pretreatment performed on the substrate W in the pre-wet bath 26 shown in FIGS. 4A and 4B. The pre-wet bath 26 and the pretreatment performed in the pre-wet bath 26 in this embodiment will now be described in detail with reference to FIGS. 4A and 4B, and FIG. 5.

As shown in FIGS. 4A and 4B, the pre-wet bath 26 includes a bath main body 81 that accommodates the substrate holder 60 holding the substrate W, an overflow bath 82, and a pretreatment liquid circulation system 100 (which corresponds to one example of the pretreatment liquid supplying device) for supplying pretreatment liquid to the pre-wet bath 26. The bath main body 81 has a drain pipe 106 for draining the pretreatment liquid held inside. Also, an ultraviolet light irradiation device 83 is arranged, in a position facing the surface to be plated of the placed substrate W, in the bath main body 81. The ultraviolet light irradiation device 83 is a device that is capable of irradiating ultraviolet light, such as a low-pressure mercury lamp, for example, and is configured to irradiate ultraviolet light onto the entire surface to be plated of the substrate W. When the ultraviolet light irradiation device 83 is a low-pressure mercury lamp, the dominant wavelengths of the irradiated ultraviolet light are 254 nm and 185 nm. Also, the low-pressure mercury lamp may have any suitable shape capable of irradiating the entire surface to be plated of the substrate W, such as straight tube shape, a U-shape, an M-shape, and a rectangular shape.

The overflow bath 82 is arranged adjacent to the bath main body 81, and is configured to receive pretreatment liquid that overflows from the bath main body 81. The pretreatment liquid circulation system 100 includes, for example, a pretreatment liquid bath 101, a pump 102, a deaeration processing portion 103, a pump 104, a filter 105, and a liquid introducing pipe 107 and the like. The pretreatment liquid bath 101 holds pretreatment liquid (e.g., deionized water) to be supplied to the bath main body 81. The pump 102 pumps the pretreatment liquid in the pretreatment liquid bath 101 to the bath main body 81 through the liquid introducing pipe 107. The deaeration processing portion 103 has a vacuum pump, for example, and deaerates the pretreatment liquid. The pump 104 pumps the pretreatment liquid in the overflow bath 82 to the bath main body 81. The filter 105 filters the pretreatment liquid that is pumped from the overflow bath 82. The configuration of the pretreatment liquid circulation system 100 is not limited to this. Any suitable configuration capable of supplying pretreatment liquid to the pre-wet bath 26 may be employed.

Figure 4C:
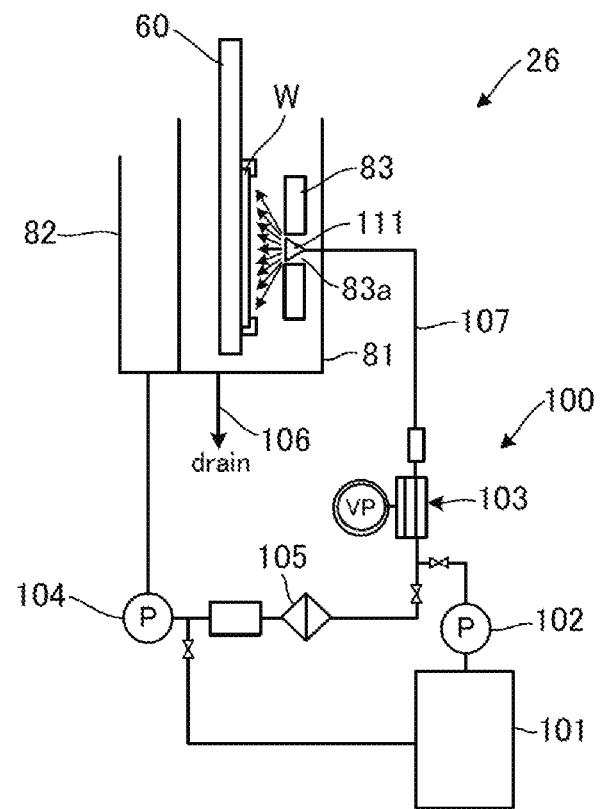
FIG. 4C is a schematic side view of the pre-wet bath according to another mode in a state in which the substrate surface is being hydrophilically treated.

The pre-wet bath 26 having the configuration shown in FIG. 4C instead of the configuration shown in FIGS. 4A and 4B may also be employed. FIG. 4C is a schematic side view of the pre-wet bath 26 according to another mode in a state in which the substrate surface is being hydrophilically treated. The pre-wet bath 26 shown in FIG. 4C is configured to spray pretreatment liquid onto the entire surface to be plated of the substrate W. More specifically, a nozzle 111 that is connected to the liquid introducing pipe 107 that supplies the pretreatment liquid is arranged in a position facing the surface to be plated of the placed substrate W, in the bath main body 81. This nozzle 111 is formed from one or a plurality of nozzles, and is arranged in a position where the pretreatment liquid can be sprayed onto the entire surface to be plated of the substrate W, for example, in a gap (an opening 83a) in the ultraviolet light irradiation device 83.

The processes shown in FIG. 5 in the pre-wet bath 26 are controlled by the control portion 45 shown in FIG. 1. To pretreat the substrate W, the substrate holder 60 holding the substrate W is arranged inside the pre-wet bath 26 (pretreatment bath), as shown in FIG. 4A (step S501). At this time, the surface to be plated of the substrate W is arranged facing the ultraviolet light irradiation device 83. Then, the ultraviolet light irradiation device 83 irradiates ultraviolet light in the atmosphere onto the surface to be plated of the substrate W (step S502). As a result, the surface to be plated is cleaned and reformed (first pretreatment). At this time, active oxygen is produced from the small amount of ozone present in the atmosphere, by the action of the ultraviolet light. This active oxygen decomposes and changes the organic matter on the surface of the substrate W into volatile matter. Also, the action of this active oxygen and the ultraviolet light causes the chemical bonds of the resist surface to break, and the active oxygen to bond to the molecules of the resist surface. As a result, a functional group having high hydrophilicity is imparted to the resist surface. That is, by irradiating ultraviolet light onto the surface of the substrate W, hydrophobic matter on the surface of the substrate W is removed, and as a result, the surface is cleaned and reformed so as to be hydrophilic.

The irradiation time of ultraviolet light onto the surface of the substrate W in an air atmosphere is preferably approximately 10 seconds to approximately three minutes, for example. This irradiation time may be appropriately determined according to the passage of time after the ashing process or the descum process is performed on the substrate W. If the irradiation time of ultraviolet light is less than 10 seconds, hydrophobic organic matter adhered to the surface of the substrate W may not be able to be sufficiently removed. Also, if the irradiation time of ultraviolet light exceeds three minutes, the resist on the surface of the substrate W may be incinerated. In this embodiment, ultraviolet light irradiation is performed in an air atmosphere, but ultraviolet light irradiation may also be performed in an ozone atmosphere or an oxygen atmosphere, for example. Here, an ozone atmosphere refers to an atmosphere into which ozone has been actively introduced, and an oxygen atmosphere refers to an atmosphere into which oxygen has been actively introduced. However, in an ozone atmosphere and an oxygen atmosphere, the amount of active oxygen produced by the action of ultraviolet light is greater, so the resist itself may decompose (be incinerated). Therefore, the irradiation time of ultraviolet light onto the surface of the substrate W in an ozone atmosphere and an oxygen atmosphere is preferably shorter than the ultraviolet light irradiation time in an air atmosphere. Also, in order to prevent the resist itself from being incinerated, ultraviolet light is preferably irradiated onto the substrate W in an air atmosphere or a vacuum atmosphere that will be described later.

Next, the pretreatment liquid circulation system 100 supplies pretreatment liquid into the pre-wet bath 26, immersing the surface to be plated of the substrate W in the pretreatment liquid as shown in FIG. 4B, or sprays pretreatment liquid supplied from the liquid introducing pipe 107 toward the surface to be plated of the substrate W with the nozzle 111 as shown in FIG. 4C (step S503). As a result, the surface to be plated of the substrate W is hydrophilically treated (second pretreatment). More specifically, the pretreatment liquid is made to continuously contact the substrate W in the pre-wet bath 26, without removing the substrate W, which has been irradiated with ultraviolet light, from the pre-wet bath 26.

After the entire surface to be plated of the substrate W has contacted the pretreatment liquid, the substrate holder 60 holding the substrate W is removed from the pre-wet bath 26 (step S504). The latter processes are performed on the substrate W that has been pretreated in the manner described above. After the pretreatment liquid contacts the surface of the substrate W, the surface of the substrate W is wet, so the substrate surface will not change to hydrophobic until the plating process is performed in the plating bath 34.

As described above, the surface of the substrate W is able to be cleaned and reformed by irradiating ultraviolet light onto the placed substrate W, in the pre-wet bath 26 shown in FIGS. 4A and 4B (or FIG. 4C). As a result, the surface of the substrate W is made hydrophilic. Also, the pretreatment liquid can be brought into contact with the surface to be plated of the substrate W by the pretreatment liquid circulation system 100 (or the nozzle 111), without transporting the substrate W out of the pre-wet bath 26, or the like. That is, ultraviolet light irradiation and the hydrophilic treatment are able to be performed in the pre-wet bath 26, without moving the substrate W from the pretreatment bath. Therefore, hydrophilic treatment (pre-wet treatment) can be performed immediately after the cleaning and reforming by ultraviolet light irradiation are performed. Therefore, the period of time after the entire surface to be plated of the substrate W is cleaned and reformed until the hydrophilic treatment is performed is able to be extremely short, and the period of time after the cleaning and reforming by ultraviolet light irradiation until the hydrophilic treatment is able to be made constant for each substrate. Consequently, the hydrophilicity of the surface of the substrate W is able to be improved, and variation in the degree of hydrophilicity with each substrate is able to be suppressed. Also, the cleaning and reforming of the substrate W and the hydrophilic treatment are able to be performed at the same time and in the same location (the same device), so the throughput of the plating apparatus 1 is able to be improved, and the footprint of the plating apparatus 1 is able to be reduced.

Also, in the pretreatment described with reference to FIG. 5, the hydrophilic treatment is performed after the irradiation of ultraviolet light onto the substrate W is complete. As a result, ultraviolet light is able to be prevented from being absorbed by the pretreatment liquid, so the substrate W can be efficiently cleaned and reformed. The invention is not limited to this. The control portion 45 may also control the ultraviolet light irradiation device 83 and the pretreatment liquid circulation system 100 such that the irradiation of ultraviolet light onto the substrate W and the hydrophilic treatment are performed at least partially simultaneously. More specifically, for example, the irradiation of ultraviolet light and the hydrophilic treatment may be started at the same time, or the hydrophilic treatment may be started first and then the ultraviolet light irradiation may be started while continuing the hydrophilic treatment. In this case, the ultraviolet light is also irradiated onto the pretreatment liquid, so the pretreatment liquid is able to be sterilized. Therefore, this pretreatment liquid is able to be used repeatedly for a longer period of time, so the running cost of the plating apparatus 1 is able to be reduced. Also, irradiation of the ultraviolet light onto the substrate W may be started first, and then the hydrophilic treatment may be simultaneously performed while continuing this ultraviolet light irradiation. In this case, ultraviolet light is prevented from being absorbed by the pretreatment liquid so the substrate W can be efficiently cleaned and reformed while only the ultraviolet light irradiation is being performed, and the pretreatment liquid is able to be sterilized while the ultraviolet light irradiation and the hydrophilic treatment are being performed simultaneously.

In the first embodiment, the substrate holder 60 and the substrate W are placed vertically in the pre-wet bath 26, but the invention is not limited to this. The substrate holder 60 and the substrate W may also be placed in the pre-wet bath 26 so that they face horizontally.

Second Embodiment

Hereinafter, a plating apparatus according to a second embodiment of the present invention will be described with reference to the accompanying drawings. The plating apparatus according to the second embodiment differs from the plating apparatus according to the first embodiment only in the configuration of the pre-wet bath 26. All other components are the same. Therefore, only the pre-wet bath 26 will be described. Descriptions of the other components will be omitted.

Figure 6A:
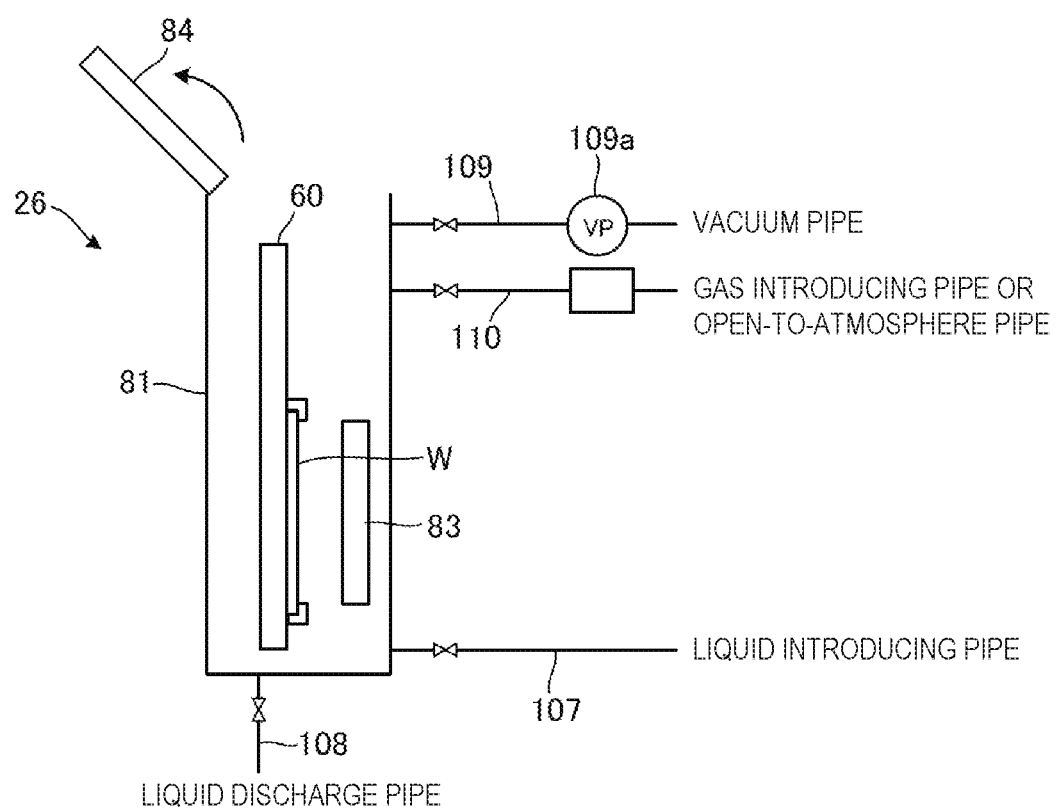
FIG. 6A is a schematic side view of the pre-wet bath with the substrate in place.
Figure 6B:
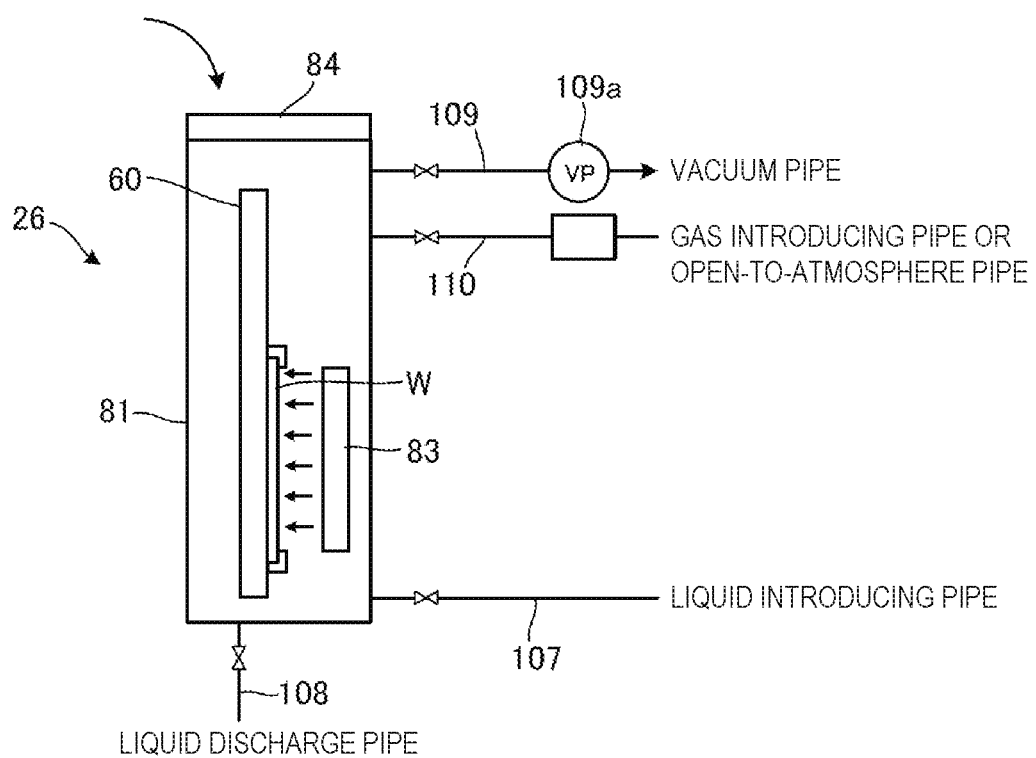
FIG. 6B is a schematic side view of the pre-wet bath in a state in which the substrate surface is being cleaned and reformed.
Figure 6C:
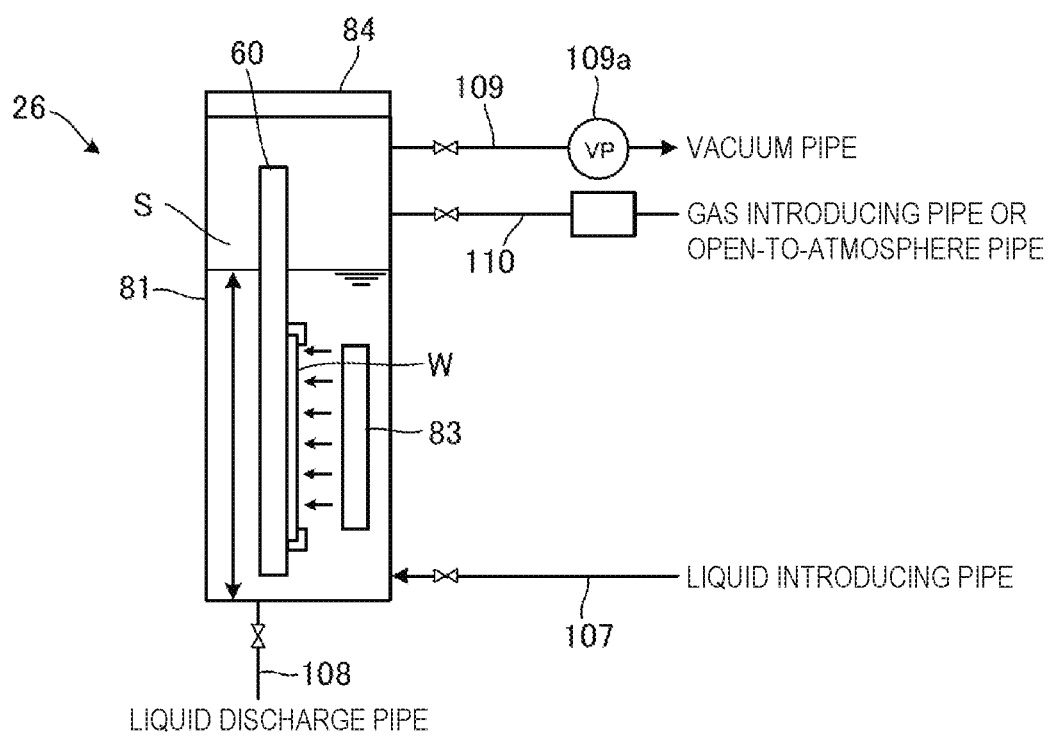
FIG. 6C is a schematic side view of the pre-wet bath in a state in which the substrate surface is being hydrophilically treated.
Figure 6D:
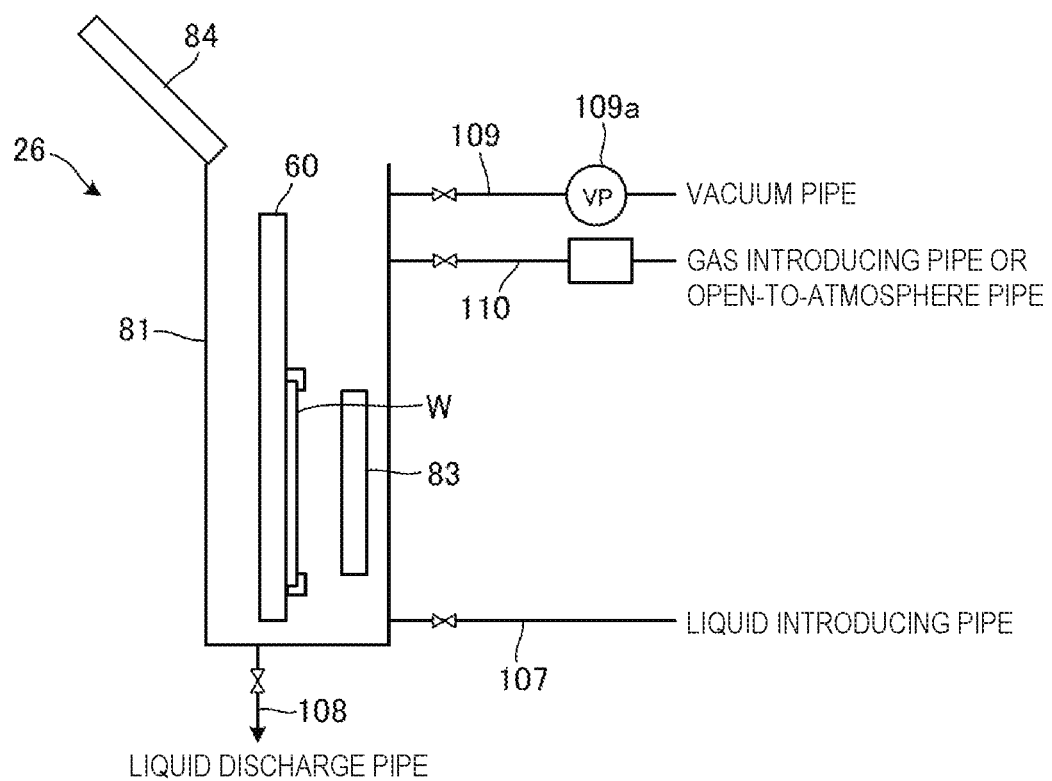
FIG. 6D is a schematic side view of the pre-wet bath when removing the substrate.
Figure 7:
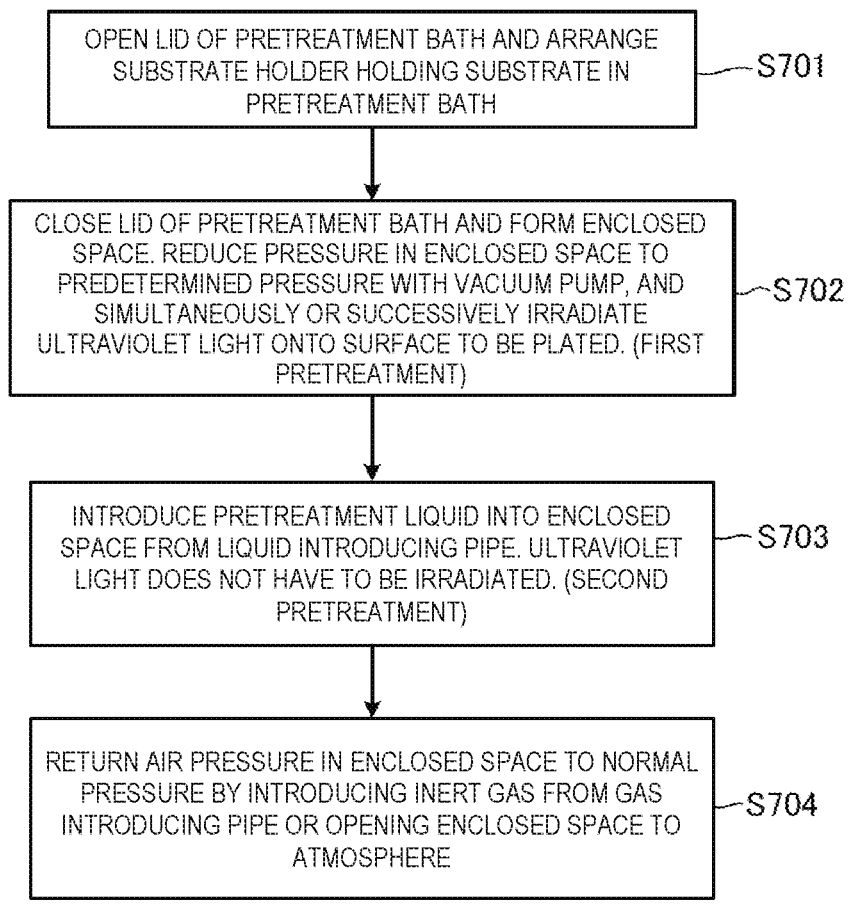
FIG. 7 is a flowchart illustrating pretreatment performed on the substrate in the pre-wet bath shown in FIGS. 6A to 6D.

FIGS. 6A to 6D are schematic side views of the pre-wet bath 26 according to the second embodiment. More specifically, FIG. 6A is a schematic side view of the pre-wet bath 26 with the substrate W in place. FIG. 6B is a schematic side view of the pre-wet bath 26 in a state in which the surface of the substrate W is being cleaned and reformed. FIG. 6C is a schematic side view of the pre-wet bath 26 in a state in which the surface of the substrate W is being hydrophilically treated. FIG. 6D is a schematic side view of the pre-wet bath 26 when removing the substrate W. Also, FIG. 7 is a flowchart illustrating pretreatment performed on the substrate W in the pre-wet bath 26 shown in FIGS. 6A to 6D. The pre-wet bath 26 and the pretreatment performed in the pre-wet bath 26 in this second embodiment will now be described in detail with reference to FIGS. 6A to 6D and FIG. 7.

As shown in FIGS. 6A to 6D, the pre-wet bath 26 includes the bath main body 81 that accommodates the substrate holder 60 holding the substrate W, a lid 84 that seals the bath main body 81, the liquid introducing pipe 107 for supplying pretreatment liquid to the pre-wet bath 26, and a liquid discharge pipe 108 for discharging the pretreatment liquid from the pre-wet bath 26. In addition, the pre-wet bath 26 includes a vacuum pipe 109 for evacuating the air inside of the bath main body 81, a vacuum pump 109a provided in the vacuum pipe 109, and a gas introducing pipe or an open-to-atmosphere pipe 110 that introduces air or gas into the bath main body 81. The pre-wet bath 26 also has the ultraviolet light irradiation device 83 in a position facing the surface to be plated of the placed substrate W, similar to the pre-wet bath 26 according to the first embodiment.

The liquid introducing pipe 107 is connected to a pretreatment liquid source, not shown, and is configured to supply pretreatment liquid (e.g., deionized water) into the pre-wet bath 26 by a pump or the like. The liquid introducing pipe 107, together with the pretreatment liquid source, the pump and the like, forms a pretreatment liquid supplying device.

The processes shown in FIG. 7 in the pre-wet bath 26 are controlled by the control portion 45 shown in FIG. 1. To pretreat the substrate W, the lid 84 of the pre-wet bath 26 (pretreatment bath) is opened by a driving mechanism, not shown, and the substrate holder 60 holding the substrate W is arranged inside the pre-wet bath 26, as shown in FIG. 6A (step S701). At this time, the surface to be plated of the substrate W is arranged facing the ultraviolet light irradiation device 83.

Next, as shown in FIG. 6B, the lid 84 of the pre-wet bath 26 is closed, and the pressure inside the pre-wet bath 26 is reduced to a predetermined pressure with the vacuum pump 109a. Simultaneously with the start of depressurization, or successively after depressurization ends, ultraviolet light is irradiated onto the surface to be plated of the substrate W by the ultraviolet light irradiation device 83 (step S702). That is, the ultraviolet light irradiation device 83 irradiates ultraviolet light onto the surface to be plated of the substrate W, in a vacuum atmosphere. As a result, the surface to be plated is cleaned and reformed (first pretreatment). Here, a vacuum atmosphere is a state of pressure lower than atmospheric pressure.

When ultraviolet light is irradiated onto the substrate W in a vacuum atmosphere, active oxygen is consequently produced from the small amount of ozone present in the pre-wet bath 26, by the action of the ultraviolet light. This active oxygen decomposes and changes the organic matter on the surface of the substrate W into volatile matter. Also, the action of this active oxygen and the ultraviolet light causes the chemical bonds of the resist surface to break, and the active oxygen to bond to the molecules of the resist surface. As a result, a functional group having high hydrophilicity is imparted to the resist surface. That is, by irradiating ultraviolet light onto the surface of the substrate W, hydrophobic matter on the surface of the substrate W is removed, and as a result, the surface is cleaned and reformed so as to be hydrophilic.

The irradiation time of ultraviolet light onto the surface of the substrate W in a vacuum atmosphere is preferably approximately 10 seconds to approximately three minutes, for example. This irradiation time may be appropriately determined according to the passage of time after the ashing process or the descum process is performed on the substrate W. If the irradiation time of ultraviolet light is less than 10 seconds, hydrophobic organic matter adhered to the surface of the substrate W may not be able to be sufficiently removed. Also, if the irradiation time of ultraviolet light exceeds three minutes, the resist on the surface of the substrate W may be incinerated.

Next, the liquid introducing pipe 107 supplies pretreatment liquid into the pre-wet bath 26, immersing the surface to be plated of the substrate W in the pretreatment liquid, as shown in FIG. 6C (step S703). As a result, the surface to be plated of the substrate W is hydrophilically treated (second pretreatment). More specifically, the control portion 45 controls the ultraviolet light irradiation device 83 and a pump that is connected to the liquid introducing pipe 107 such that the ultraviolet light irradiation onto the substrate W and the contact of the pretreatment liquid with the substrate W are performed at least partially simultaneously. The ultraviolet light irradiation may be ended when the pretreatment liquid contacts the substrate W.

At this time, the pretreatment liquid is supplied to the pre-wet bath 26 so as to be at least at a level at which the surface to be plated of the substrate W is immersed in the pretreatment liquid, and the pretreatment liquid will not enter the space inside the substrate holder 60 shown in FIG. 3. In other words, there is a region S in the pre-wet bath 26 where there is no pretreatment liquid, and the substrate holder 60 is immersed in the pretreatment liquid such that the space inside the substrate holder 60 shown in FIG. 3 is communicated with the region S via the communication hole 65a. As described with reference to FIG. 3, the substrate W is held by the substrate holder 60 in a state in which the peripheral edge portion of the substrate W is sealed. When differential pressure occurs between the inside of the substrate holder 60 and the outside of the substrate holder 60 when the pre-wet bath 26 in which this substrate holder 60 has been placed is given a vacuum atmosphere, the substrate may bend backward. Therefore, the space inside the substrate holder 60 is configured to be communicated with the space outside the substrate holder 60, as shown in FIG. 3, so that differential pressure does not occur between the inside and the outside of the substrate holder 60. When this substrate holder 60 is immersed in the pretreatment liquid, the pretreatment liquid may enter the space inside the substrate holder 60. Therefore, when the substrate W is immersed in the pretreatment liquid, the space inside the substrate holder 60 is communicated with a space outside of the pretreatment liquid, so the pretreatment liquid is able to be prevented from entering the space inside the substrate holder 60, while the substrate W is prevented from bending in the vacuum atmosphere.

The hydrophilic treatment may also be performed in the pre-wet bath 26 provided with the nozzle 111 such as that shown in FIG. 4C, instead of the configuration of the pre-wet bath 26 shown in FIG. 6C. That is, the configuration may also be such that the pretreatment liquid is sprayed onto the entire surface to be plated of the substrate W, instead of immersing the entire surface to be plated of the substrate W in the pretreatment liquid. In this case, the nozzle 111 that is connected to the liquid introducing pipe 107 is arranged in a position facing the surface to be plated of the placed substrate W, in the bath main body 81. This nozzle 111 is formed from one or a plurality of nozzles, and is arranged in a position where the pretreatment liquid can be sprayed onto the entire surface to be plated of the substrate W, for example, in a gap (an opening 83a) in the ultraviolet light irradiation device 83.

After sufficient hydrophilic treatment is performed on the surface to be plated of the substrate W, inert gas is introduced into the pre-wet bath 26 from the gas introducing pipe 110, or the pre-wet bath 26 is opened to the atmosphere by the open-to-atmosphere pipe 110. As a result, the air pressure in the pre-wet bath 26 returns to atmospheric pressure (normal pressure). Then, the pretreatment liquid is discharged from the liquid discharge pipe 108, the lid 84 is opened, and the substrate holder 60 is removed from the pre-wet bath 26 (step S704). The latter processes are performed on the substrate W that has been pretreated in the manner described above.

As described above, the surface of the substrate W is able to be cleaned and reformed by irradiating ultraviolet light onto the placed substrate W, in the pre-wet bath 26 shown in FIGS. 6A to 6D. As a result, the surface of the substrate W is made hydrophilic. Also, the pretreatment liquid can be brought into contact with the surface to be plated of the substrate W by the pretreatment liquid circulation system 100, without transporting the substrate W out of the pre-wet bath 26, or the like. That is, ultraviolet light irradiation and the hydrophilic treatment are able to be performed in the pre-wet bath 26, without moving the substrate W from the pretreatment bath. Therefore, hydrophilic treatment (pre-wet treatment) can be performed immediately after the cleaning and reforming by ultraviolet light irradiation are performed, so the period of time after the surface of the substrate W is cleaned and reformed until the hydrophilic treatment is performed is able to be extremely short, and the period of time after the cleaning and reforming by ultraviolet light irradiation until the hydrophilic treatment is able to be made constant for each substrate. Consequently, the hydrophilicity of the surface of the substrate W is able to be improved, and variation in the degree of hydrophilicity with each substrate is able to be suppressed. Also, the cleaning and reforming of the substrate W and the hydrophilic treatment are able to be performed at the same time and in the same location (the same device), so the throughput of the plating apparatus 1 is able to be improved, and the footprint of the plating apparatus 1 is able to be reduced.

Also, in the pretreatment described with reference to FIG. 7, ultraviolet light starts to be irradiated onto the substrate W before the pretreatment liquid contacts the substrate W. As a result, ultraviolet light is able to be irradiated onto the substrate W without the ultraviolet light being absorbed by the pretreatment liquid, so the substrate W can be efficiently cleaned and reformed. Also, in the pre-wet bath 26 according to the second embodiment, irradiation of ultraviolet light onto the substrate W and contact of the pretreatment liquid with the substrate W are performed at least partially simultaneously. In this case, the ultraviolet light is also irradiated onto the pretreatment liquid, so the pretreatment liquid is able to be sterilized. Therefore, this pretreatment liquid is able to be used repeatedly for a longer period of time, so the running cost of the plating apparatus 1 is able to be reduced. The invention is not limited to this. The hydrophilic treatment may also be performed after irradiation of ultraviolet light onto the substrate W is complete, or the ultraviolet light irradiation and the hydrophilic treatment may be started simultaneously, similar to the first embodiment. Also, the hydrophilic treatment may be started first and then the ultraviolet light irradiation may be started while continuing the hydrophilic treatment.

Also, in the pre-wet bath 26 of the plating apparatus according to the second embodiment, ultraviolet light is irradiated onto the substrate W in a vacuum atmosphere, so the substrate surface is able to be cleaned and reformed while preventing active oxygen of an amount that would incinerate the resist of the substrate from being produced. Furthermore, in this pre-wet bath 26, the pretreatment liquid is brought into contact with the surface to be plated of the substrate in the vacuum atmosphere, so the pretreatment liquid is more easily able to enter the opening in the resist pattern formed on the substrate W, and as a result, the surface of the substrate W is able to be suitably hydrophilically treated.

In the pre-wet bath 26 according to the second embodiment, ultraviolet light irradiation is performed at the same time as evacuation, or after evacuation is complete. However, the invention is not limited to this. Ultraviolet light may also be irradiated onto the substrate W before evacuation. Also, in the second embodiment, the substrate holder 60 is placed vertically in the pre-wet bath 26, but the invention is not limited to this. The substrate holder 60 may also be placed in the pre-wet bath 26 so as to face horizontally.

Third Embodiment

Hereinafter, a plating apparatus according to a third embodiment of the present invention will be described with reference to the accompanying drawings. The plating apparatus according to the third embodiment differs from the plating apparatus according to the first embodiment only in the configuration of the pre-wet bath 26. All other components are the same. Therefore, only the pre-wet bath 26 will be described. Descriptions of the other components will be omitted.

Figure 8:
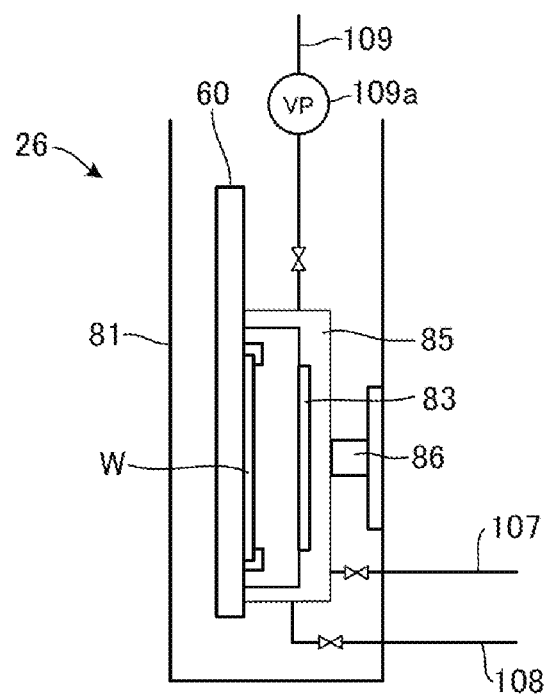
FIG. 8 is a schematic side view of the pre-wet bath according to a third embodiment.
Figure 9:
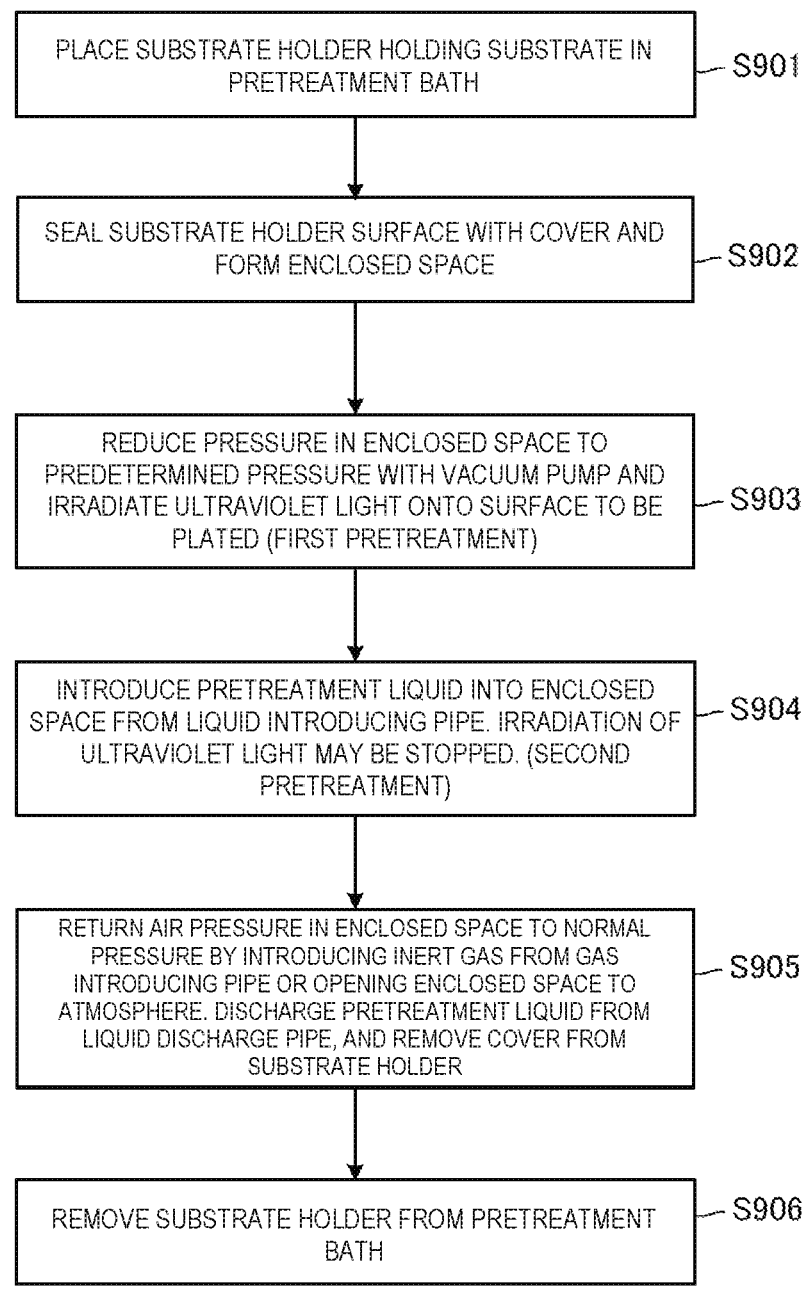
FIG. 9 is a flowchart illustrating pretreatment performed on the substrate in the pre-wet bath shown in FIG. 8.

FIG. 8 is a schematic side view of the pre-wet bath 26 according to the third embodiment. Also, FIG. 9 is a flowchart illustrating pretreatment performed on the substrate W in the pre-wet bath 26 shown in FIG. 8. The pre-wet bath 26 and the pretreatment performed in the pre-wet bath 26 in this third embodiment will now be described in detail with reference to FIGS. 8 and 9.

As shown in FIG. 8, the pre-wet bath 26 includes the bath main body 81 that accommodates the substrate holder 60 holding the substrate W, a cover 85, the vacuum pipe 109, the vacuum pump 109*a*, the liquid introducing pipe 107, the liquid discharge pipe 108, a cover drive unit 86, and the ultraviolet light irradiation device 83.

The cover 85 is arranged inside the pre-wet bath 26 and is configured to hermetically cover the substrate W that is held by the substrate holder 60, by contacting the surface of the substrate holder 60. The vacuum pipe 109 is communicated with the inside of the cover 85. The vacuum pump 109*a* is configured to discharge air from an enclosed space inside the cover 85. The liquid introducing pipe 107 is configured to introduce pretreatment liquid into the cover 85. Also, the liquid discharge pipe 108 is configured to discharge the pretreatment liquid that is inside the cover 85 out of the pre-wet bath 26. The cover drive unit 86 is a drive unit such as an air cylinder mechanism, for example, and is configured to move the cover 85 toward or away from the substrate holder 60. The ultraviolet light irradiation device 83 is mounted to the cover 85, and is configured to irradiate ultraviolet light onto the entire surface to be plated of the substrate W, while the cover 85 is hermetically covering the substrate W.

The processes shown in FIG. 9 in the pre-wet bath 26 are controlled by the control portion 45 shown in FIG. 1. To pretreat the substrate W, the substrate holder 60 holding the substrate W is first arranged inside the pre-wet bath 26 (step S901).

Then, the cover drive unit 86 drives the cover 85 in a direction toward the substrate W, such that the surface of the substrate holder 60 is sealed by the cover 85, with the cover 85 covering the substrate W. As a result, an enclosed space is formed by the substrate holder 60 and the cover 85 (step S902).

After this enclosed space is formed, the pressure inside the enclosed space is reduced to a predetermined pressure with the vacuum pump 109*a*. Simultaneously with the start of depressurization, or successively after depressurization ends, ultraviolet light is irradiated onto the surface to be plated of the substrate W by the ultraviolet light irradiation device 83 (step S903). That is, the ultraviolet light irradiation device 83 irradiates ultraviolet light onto the surface to be plated of the substrate W, in a vacuum atmosphere. As a result, the surface to be plated is cleaned and reformed (first pretreatment). The irradiation time of ultraviolet light onto the surface of the substrate W in the vacuum atmosphere may be the same as the irradiation time in the second embodiment.

Next, the liquid introducing pipe 107 supplies pretreatment liquid into the enclosed space, immersing the surface to be plated of the substrate W in the pretreatment liquid (step S904). As a result, the surface to be plated of the substrate W is hydrophilically treated (second pretreatment). More specifically, the control portion 45 controls the ultraviolet light irradiation device 83 and a pump that is connected to the liquid introducing pipe 107 such that the ultraviolet light irradiation onto the substrate W and the contact of the pretreatment liquid with the substrate W are performed at least partially simultaneously. The ultraviolet light irradiation may be ended when the pretreatment liquid contacts the substrate W. At this time, the substrate W is immersed in the pretreatment liquid such that the surface to be plated of the substrate W is immersed in the pretreatment liquid, and the space inside the substrate holder 60 shown in FIG. 3 is communicated with a space outside of the pretreatment liquid.

In the pre-wet bath 26 according to the third embodiment, ultraviolet light irradiation is performed at the same time as evacuation, or after evacuation is complete. However, the invention is not limited to this. Ultraviolet light may also be irradiated onto the substrate W before evacuation. Also, in the pre-wet bath 26 according to the third embodiment, irradiation of ultraviolet light onto the substrate W is started before the pretreatment liquid contacts the substrate W, and irradiation of ultraviolet light onto the substrate W and contact of the pretreatment liquid with the substrate W are performed at least partially simultaneously. However, the invention is not limited to this. The hydrophilic treatment may also be performed after irradiation of ultraviolet light onto the substrate W is complete, or the ultraviolet light irradiation and the hydrophilic treatment may be started simultaneously, similar to the first embodiment. Also, the hydrophilic treatment may be started first and then the ultraviolet light irradiation may be started while continuing the hydrophilic treatment.

After sufficient hydrophilic treatment is performed on the surface to be plated of the substrate W, inert gas is introduced into the enclosed space from the gas introducing pipe 110, or the enclosed space is opened to the atmosphere by the open-to-atmosphere pipe 110. As a result, the air pressure in the enclosed space returns to atmospheric pressure (normal pressure). Then, the pretreatment liquid is discharged from the liquid discharge pipe 108, the cover drive unit 86 drives the cover 85 in the direction away from the substrate W, and removes the cover 85 from the substrate holder 60 (step S905). Finally, the substrate holder 60 is removed from the pre-wet bath 26 (step S906). The latter processes are performed on the substrate W that has been pretreated in the manner described above.

The plating apparatus according to the third embodiment has the following advantages in addition to the advantages of the plating apparatus according to the second embodiment. That is, in the third embodiment, the enclosed space is formed by the cover 85 and the substrate holder 60, so the vacuum pump 109a need only evacuate the air only inside the cover 85, and the liquid introducing pipe 107 need only supply the pretreatment liquid only into the cover 85. Therefore, the amount of pretreatment liquid is able to be reduced and the evacuation time and the time required to supply the pretreatment liquid are able to be shorter, compared to when air is evacuated from the pre-wet bath 26 and the pre-wet bath 26 is filled with pretreatment liquid.

Fourth Embodiment

Hereinafter, a plating apparatus according to a fourth embodiment of the present invention will be described with reference to the accompanying drawings. The plating apparatus according to the fourth embodiment differs from the plating apparatus according to the first embodiment only in the configuration of the pre-wet bath 26. All other components are the same. Therefore, only the pre-wet bath 26 will be described. Descriptions of the other components will be omitted.

Figure 10A:
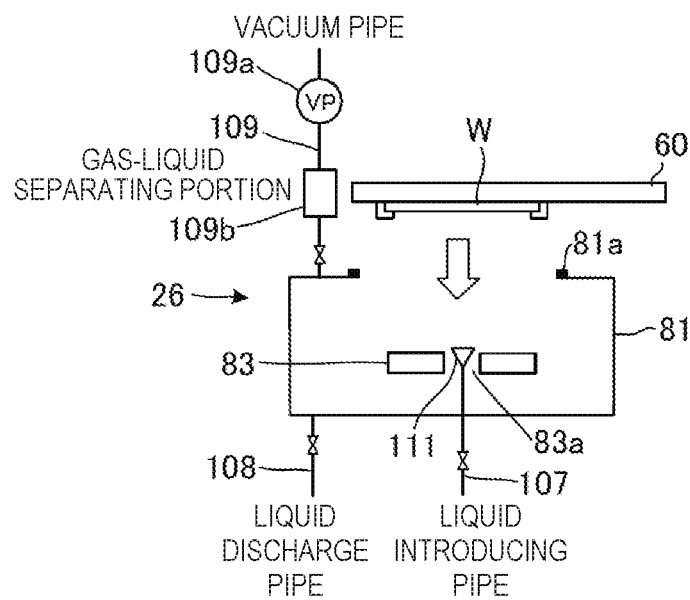
FIG. 10A is a schematic side view of the pre-wet bath before sealing an opening.
Figure 10B:
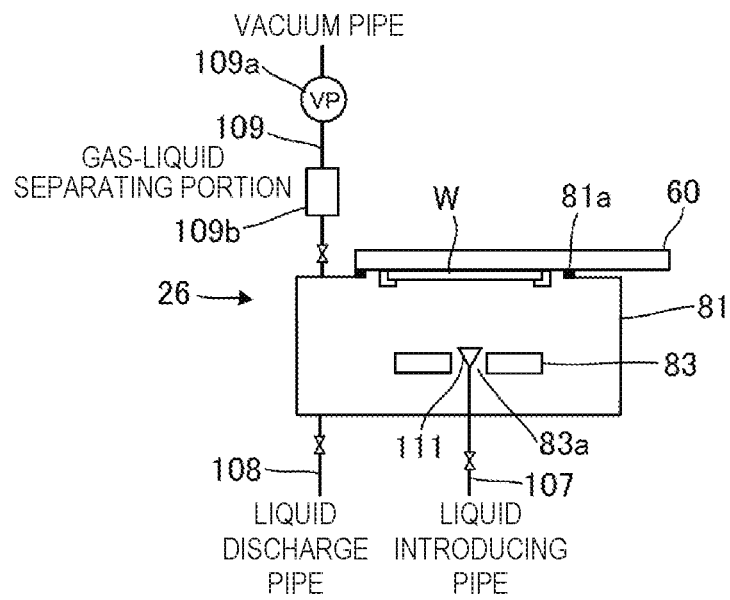
FIG. 10B is a schematic side view of the pre-wet bath in a state in which the opening is sealed.
Figure 10C:
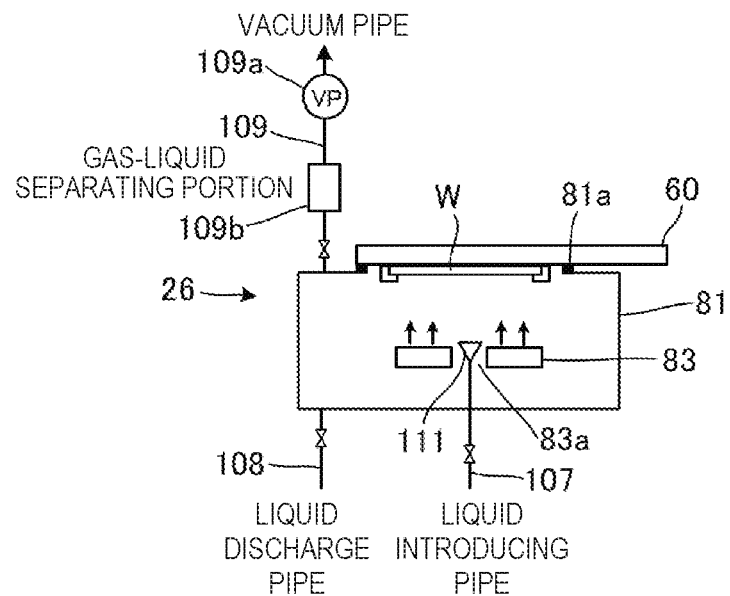
FIG. 10C is a schematic side view of the pre-wet bath in a state in which the substrate surface is being cleaned and reformed.
Figure 10D:
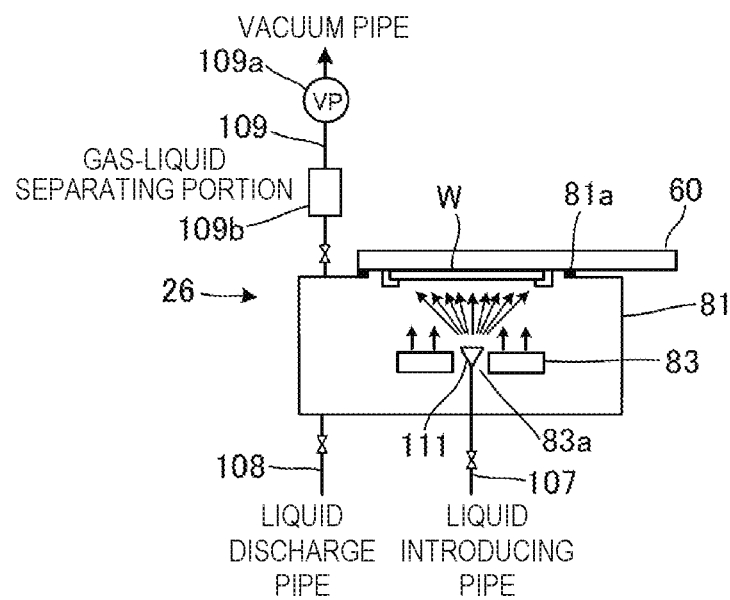
FIG. 10D is a schematic side view of the pre-wet bath in a state in which the substrate surface is being hydrophilically treated.
Figure 10E:
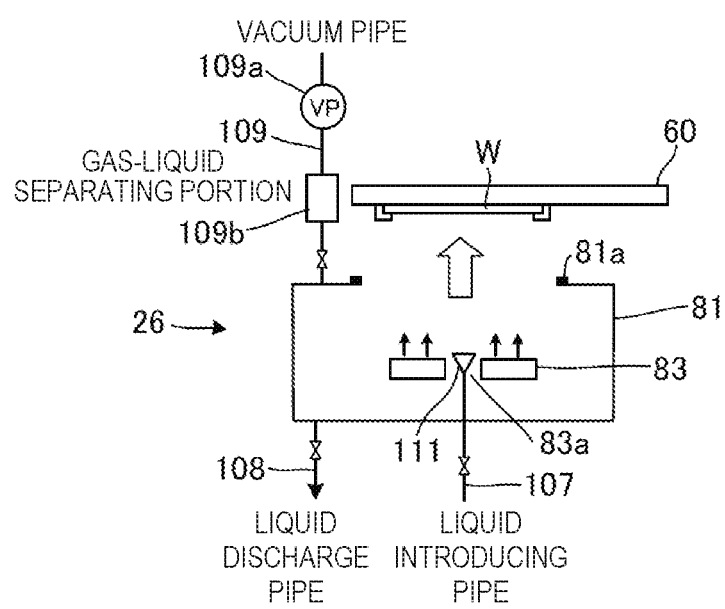
FIG. 10E is a schematic side view of the pre-wet bath in a state in which the opening is open.
Figure 11:
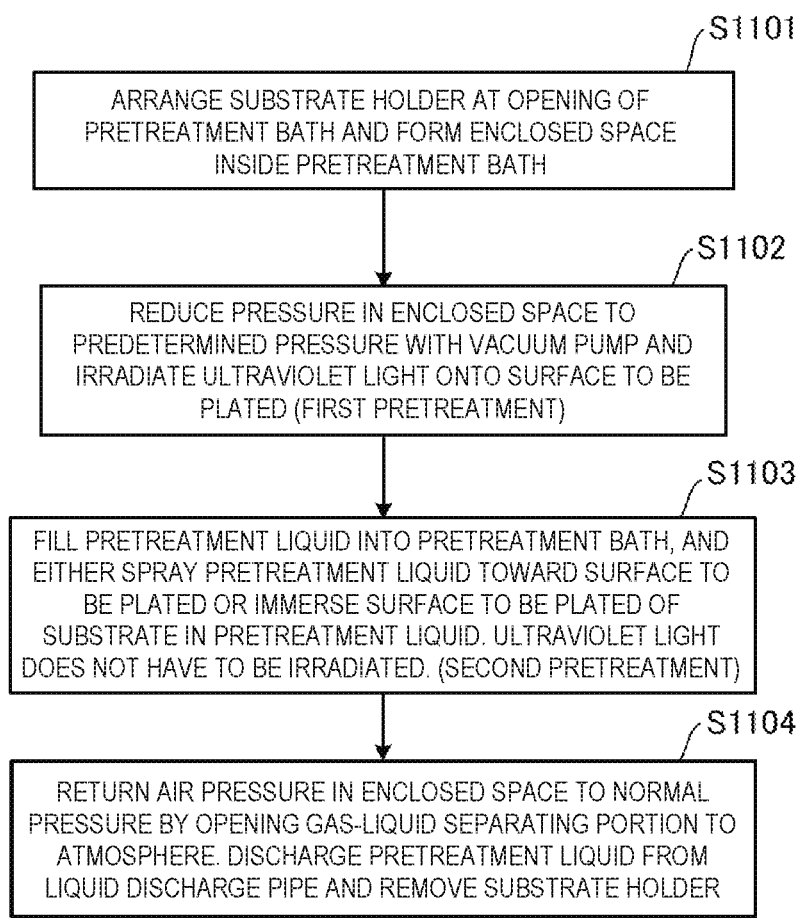
FIG. 11 is a flowchart illustrating pretreatment performed on the substrate in the pre-wet bath shown in FIGS. 10A to 10E.

FIGS. 10A to 10E are schematic side views of the pre-wet bath 26 according to the fourth embodiment. More specifically, FIG. 10A is a schematic side view of the pre-wet bath 26 before sealing an opening. FIG. 10B is a schematic side view of the pre-wet bath 26 in a state in which the opening is sealed. FIG. 10C is a schematic side view of the pre-wet bath 26 in a state in which the surface of the substrate W is being cleaned and reformed. FIG. 10D is a schematic side view of the pre-wet bath 26 in a state in which the surface of the substrate W is being hydrophilically treated. FIG. 10E is a schematic side view of the pre-wet bath 26 in a state in which the opening is open. Also, FIG. 11 is a flowchart illustrating pretreatment performed on the substrate W in the pre-wet bath 26 shown in FIGS. 10A to 10E. The pre-wet bath 26 and the pretreatment performed in the pre-wet bath 26 in this fourth embodiment will now be described in detail with reference to FIGS. 10A to 10E and FIG. 11.

As shown in FIGS. 10A to 10E, the pre-wet bath 26 includes the bath main body 81 that has an opening, the nozzle 111 that is connected to the liquid introducing pipe 107 for supplying the pretreatment liquid to the pre-wet bath 26, and the liquid discharge pipe 108 for discharging the pretreatment liquid from the pre-wet bath 26. In addition, the pre-wet bath 26 includes the vacuum pipe 109 for evacuating the air inside of the bath main body 81, the vacuum pump 109a provided in the vacuum pipe 109, a gas-liquid separating portion 109b that separates gas and liquid inside the vacuum pipe 109, and the ultraviolet light irradiation device 83. The ultraviolet light irradiation device 83 has a through-hole 83a in the center. This nozzle 111 is formed from one or a plurality of nozzles, and is arranged in a position where the pretreatment liquid can be sprayed onto the entire surface to be plated of the substrate W, for example, in a gap (an opening 83a) in the ultraviolet light irradiation device 83.

A seal member 81a is provided on a peripheral edge portion of the opening of the bath main body 81. The seal member 81a is formed so as to match up with a surface (that corresponds to one example of a sealing surface) of the first holding member 65 of the substrate holder 60. As a result, when the substrate holder 60 is arranged substantially horizontally at the opening of the bath main body 81, the opening of the bath main body 81 is sealed by the surface of the first holding member 65 of the substrate holder 60.

The processes shown in FIG. 11 in the pre-wet bath 26 are controlled by the control portion 45 shown in FIG. 1. To pretreat the substrate W, the substrate holder 60 is arranged horizontally as shown in FIG. 10A, and the opening of the bath main body 81 is sealed by the surface of the first holding member 65 of the substrate holder 60, as shown in FIG. 10B. As a result, an enclosed space is formed inside the bath main body 81 (step S1101). At this time, the surface to be plated of the substrate W is exposed inside the bath main body 81.

Next, as shown in FIG. 10C, the pressure inside the pre-wet bath 26 is reduced to a predetermined pressure with the vacuum pump 109a. Simultaneously with the start of depressurization, or successively after depressurization ends, ultraviolet light is irradiated onto the surface to be plated of the substrate W by the ultraviolet light irradiation device 83 (step S1102). That is, the ultraviolet light irradiation device 83 irradiates ultraviolet light onto the surface to be plated of the substrate W, in a vacuum atmosphere. As a result, the surface to be plated is cleaned and reformed (first pretreatment). The irradiation time of ultraviolet light onto the surface of the substrate W in the vacuum atmosphere may be the same as the irradiation time in the second embodiment.

Next, the nozzle 111 that is connected to the liquid introducing pipe 107 supplies pretreatment liquid into the pre-wet bath 26, and sprays the pretreatment liquid onto the surface to be plated of the substrate W, as shown in FIG. 10D (step S1103). As a result, the surface to be plated of the substrate W is hydrophilically treated (second pretreatment). More specifically, the control portion 45 controls the ultraviolet light irradiation device 83 and a pump that is connected to the liquid introducing pipe 107 such that the ultraviolet light irradiation onto the substrate W and the contact of the pretreatment liquid with the substrate W are performed at least partially simultaneously. The ultraviolet light irradiation may be ended when the pretreatment liquid contacts the substrate W. Also, strain on the substrate when reducing the pressure in the pre-wet bath 26 may be reduced by connecting (communicating) the space inside the substrate holder 60 shown in FIG. 3 and the vacuum pipe 109 with a detachable pipe (not shown).

Instead of spraying the pretreatment liquid onto the entire surface to be plated of the substrate W by connecting the nozzle 111 to the liquid introducing pipe 107, the pretreatment liquid may be supplied into the bath main body 81 and the surface to be plated of the substrate W may be immersed in the pretreatment liquid, while reducing the pressure inside the bath main body 81 with the vacuum pump 109a. Also, in the state in which the substrate holder 60 seals the opening of the bath main body 81, the substrate holder 60 may be arranged at the opening of the bath main body 81 such that the substrate W is inclined with respect to horizontal by adjusting the shape of the opening of the bath main body 81. In this case, when the pretreatment liquid is filled in the pre-wet bath 26, the pretreatment liquid will easily enter the opening of the resist pattern on the substrate due to the inclination of the substrate, so air is able to be inhibited from remaining on the substrate surface.

After sufficient hydrophilic treatment is performed on the surface to be plated of the substrate W, the pre-wet bath 26 is opened to the atmosphere by opening the gas-liquid separating portion 109b to the atmosphere. As a result, the air pressure inside the pre-wet bath 26 returns to atmospheric pressure (normal pressure). Then, the pretreatment liquid is discharged from the liquid discharge pipe 108, and the substrate holder 60 is removed from the pre-wet bath 26, as shown in FIG. 10E (step S1104). The latter processes are performed on the substrate W that has been pretreated in the manner described above.

The plating apparatus according to the fourth embodiment has the following advantages in addition to the advantages of the plating apparatus according to the second embodiment. That is, the substrate holder 60 serves as a lid that seals the opening of the pre-wet bath 26 (the bath main body 81). Therefore, a lid for sealing the opening of the pre-wet bath 26 does not need to be prepared, so the cost of the plating apparatus 1 is able to be reduced. Also, when the lid of the opening of the pre-wet bath 26 is provided separately from the substrate holder 60, the placing of the substrate holder 60 in the pretreatment bath and the opening and closing of the lid must be performed separately. In contrast, in the fourth embodiment, the opening of the pre-wet bath 26 is able to be opened and closed by the substrate holder 60, so transport of the substrate holder 60 and opening and closing of the opening of the pre-wet bath 26 are able to be performed simultaneously. Therefore, the number of procedures for arranging the substrate holder 60 in the pre-wet bath 26 is able to be reduced compared to the related art, and as a result, the time required for treatment is able to be shorter.

In the pre-wet bath 26 according to the fourth embodiment, ultraviolet light irradiation is performed at the same time as evacuation, or after evacuation is complete. However, the invention is not limited to this. Ultraviolet light may also be irradiated onto the substrate W before evacuation. Also, in the pre-wet bath 26 according to the fourth embodiment, irradiation of ultraviolet light onto the substrate W is started before the pretreatment liquid contacts the substrate W, and irradiation of ultraviolet light onto the substrate W and contact of the pretreatment liquid with the substrate W are performed at least partially simultaneously. However, the invention is not limited to this. The hydrophilic treatment may also be performed after irradiation of ultraviolet light onto the substrate W is complete, or the ultraviolet light irradiation and the hydrophilic treatment may be started simultaneously, similar to the first embodiment. Also, the hydrophilic treatment may be started first and then the ultraviolet light irradiation may be started while continuing the hydrophilic treatment.

While embodiments of the present invention have been described above, these embodiments of the present invention are intended to facilitate understanding of the present invention and in no way limit the present invention. The present invention may be modified and improved without departing from the spirit thereof, and it goes without saying that equivalents are included in the present invention. Also, the constituent elements described in the claims and the specification may be suitably combined or omitted within a scope that enables at least a portion of the problems described above to be solved, or within a scope in which at least a portion of the effects are displayed.

For example, the ultraviolet light irradiation device 83 may be outside the pre-wet bath 26. In this case, a portion of the pre-wet bath 26 is formed by material that transmits ultraviolet light. As a result, the ultraviolet light irradiation device 83 is able to irradiate ultraviolet light onto the surface of the substrate W from outside the pre-wet bath 26. Also, the oxidized film may also be removed in the pre-wet bath 26 by discharging the pretreatment liquid and introducing a chemical liquid used in the pre-soak bath 28 into the pre-wet bath 26, after the hydrophilic treatment in the pre-wet bath 26 is complete. In this case, the pre-soak bath 28 is no longer necessary. Furthermore, in the first, second, and fourth embodiments, the ultraviolet light irradiation device 83 is provided separately from the bath main body 81, inside the bath main body 81, but the ultraviolet light irradiation device 83 may also be arranged incorporated into a wall surface of the bath main body 81. In this case, the area where the pretreatment liquid contacts the ultraviolet light irradiation device 83 can be reduced, so the chances of a short occurring can be reduced.

REFERENCE SIGNS LIST

1 . . . plating apparatus
26 . . . pre-wet bath
34 . . . plating bath
45 . . . control portion
60 . . . substrate holder
65 . . . first holding member
65a . . . through-hole
70 . . . seal member
81 . . . bath main body
83 . . . ultraviolet light irradiation device
84 . . . lid
85 . . . cover
100 . . . pretreatment liquid circulation system
102 . . . pump
107 . . . liquid introducing pipe
109 . . . vacuum pipe
109a . . . vacuum pump

What is claimed is:

1. A plating apparatus that performs an electrolytic plating process on a substrate having a resist pattern, comprising:
  a pretreatment bath that performs hydrophilic treatment by bringing a pretreatment liquid into contact with a surface to be plated of the substrate;
  a plating bath that performs a plating process on a substrate that has undergone the hydrophilic treatment,
  wherein the pretreatment bath includes a pretreatment liquid supplying device that supplies the pretreatment liquid into the pretreatment bath, and
  an ultraviolet light irradiation device that irradiates ultraviolet light onto the surface to be plated of the substrate;
  wherein the ultraviolet light irradiation device is arranged in the pretreatment bath; and
  a control portion configured to control the pretreatment liquid supplying device and the ultraviolet light irradiation device at least by causing the ultraviolet light irradiation device to irradiate ultraviolet light onto the surface to be plated of the substrate in an air atmosphere before causing the pretreatment liquid supplying device to supply pretreatment liquid to cover the surface of the substrate to be plated.

2. The plating apparatus according to claim 1,
  wherein the control portion is further configured to control the ultraviolet light irradiation device and the pretreatment liquid supplying device at least to cause the pretreatment liquid supplying device to bring the pretreatment liquid into contact with the substrate after starting the irradiation of ultraviolet light onto the substrate.

3. The plating apparatus according to claim 1, further comprising:

wherein the control portion is further configured to control the ultraviolet light irradiation device and the pretreatment liquid supplying device at least to cause the irradiation of ultraviolet light onto the substrate and the contact of the pretreatment liquid with the substrate are performed at least partially simultaneously.

4. The plating apparatus according to claim 1, wherein the ultraviolet light irradiation device is arranged in a bath main body of the pretreatment bath, the bath main body of the pretreatment bath receiving the pretreatment liquid and containing a substrate holder for holding the substrate.

5. A plating apparatus that performs an electrolytic plating process on a substrate having a resist pattern, comprising:
a pretreatment bath that performs hydrophilic treatment by bringing a pretreatment liquid into contact with a surface to be plated of the substrate;
a plating bath that performs a plating process on a substrate that has undergone the hydrophilic treatment,
wherein the pretreatment bath includes a pretreatment liquid supplying device that supplies the pretreatment liquid into the pretreatment bath, and an ultraviolet light irradiation device that irradiates ultraviolet light onto the surface to be plated of the substrate;
wherein the ultraviolet light irradiation device is arranged in the pretreatment bath;
wherein the substrate is placed vertically in the pretreatment bath;
wherein the ultraviolet light irradiation device is arranged in a position facing the substrate and is configured to irradiate ultraviolet light onto the entire surface to be plated of the substrate; and
wherein the pretreatment liquid supplying device is configured to supply the pretreatment liquid from a bottom of the pretreatment bath into the pretreatment bath; and
a control portion configured to control the pretreatment liquid supplying device and the ultraviolet light irradiation device at least by causing the pretreatment liquid supplying device to supply pretreatment liquid to the pretreatment bath after causing the ultraviolet light irradiation device to irradiate ultraviolet light onto the surface to be plated of the substrate.

6. A plating apparatus that performs an electrolytic plating process on a substrate having a resist pattern, comprising:
a pretreatment bath that performs hydrophilic treatment by bringing a pretreatment liquid into contact with a surface to be plated of the substrate; and
a plating bath that performs a plating process on a substrate that has undergone the hydrophilic treatment,
wherein the pretreatment bath includes a pretreatment liquid supplying device that supplies the pretreatment liquid into the pretreatment bath, and an ultraviolet light irradiation device that irradiates ultraviolet light onto the surface to be plated of the substrate;
wherein the ultraviolet light irradiation device is arranged in the pretreatment bath;
wherein the substrate is placed vertically in the pretreatment bath;
wherein the ultraviolet light irradiation device is arranged in a position facing the substrate and is configured to irradiate ultraviolet light onto the entire surface to be plated of the substrate; and
wherein the pretreatment liquid supplying device comprises a nozzle arranged in an opening of the ultraviolet light irradiation device.

7. A plating apparatus that performs an electrolytic plating process on a substrate having a resist pattern, comprising:
a pretreatment bath that performs hydrophilic treatment by bringing a pretreatment liquid into contact with a surface to be plated of the substrate; and
a plating bath that performs a plating process on a substrate that has undergone the hydrophilic treatment,
wherein the pretreatment bath includes a pretreatment liquid supplying device that supplies the pretreatment liquid into the pretreatment bath, and means for irradiating an ultraviolet light that irradiates ultraviolet light onto the surface to be plated of the substrate;
wherein the means for irradiating an ultraviolet light is arranged in the pretreatment bath; and
a controller configured to control the pretreatment liquid supplying device and the means for irradiating an ultraviolet light by causing the irradiation of ultraviolet light onto the surface to be plated of the substrate in an air atmosphere before bringing pretreatment liquid into contact with the surface of the substrate to be plated.

8. A plating method comprising:
arranging a substrate having a resist pattern in a pretreatment bath;
cleaning and reforming a surface of the substrate by irradiating ultraviolet light onto a surface to be plated of the substrate while the substrate is arranged inside the pretreatment bath;
after irradiating ultraviolet light onto the surface to be plated, hydrophilically treating the substrate surface by bringing a pretreatment liquid into contact with the surface to be plated of the substrate, inside the pretreatment bath; and
performing a plating process on the substrate surface which has undergone the cleaning and reforming and the hydrophilic treatment by bringing the pretreatment liquid into contact with the substrate surface.

9. The plating method according to claim 8, wherein hydrophilically treating the substrate surface by bringing the pretreatment liquid into contact with the surface without removing the substrate from the pretreatment bath after the cleaning and reforming step has started.

10. The plating method according to claim 8, wherein cleaning and reforming the surface of the substrate and bringing the pretreatment liquid into contact with the surface are executed at least partially simultaneously.

11. The plating method according to claim 8, wherein the irradiating ultraviolet light onto the surface to be plated of the substrate occurs in an air atmosphere or a vacuum atmosphere.

12. The plating method according to claim 11, further comprising:
sealing the pretreatment bath after the substrate is arranged in the pretreatment bath; and
evacuating air from within the pretreatment bath after the pretreatment bath is sealed,
wherein the hydrophilically treating the substrate surface includes a step of bringing the pretreatment liquid into contact with the surface to be plated of the substrate in the vacuum atmosphere.

13. The plating method according to claim 12, further comprising:
holding the substrate with a substrate holder such that a peripheral edge portion of the substrate is sealed, and the surface to be plated of the substrate is exposed,
wherein hydrophilically treating the substrate surface includes immersing the substrate in the pretreatment liquid such that the surface to be plated of the substrate is immersed in the pretreatment liquid, and a space inside the substrate holder is communicated with a space outside of the pretreatment liquid.

14. The plating method according to claim 11, further comprising:

holding the substrate with a substrate holder such that the surface to be plated of the substrate is exposed;

sealing an opening provided in the pretreatment bath with the substrate holder; and evacuating air from within the pretreatment bath while the opening is sealed.

15. The plating method according to claim 14, wherein sealing includes arranging the substrate holder at the opening such that the substrate is inclined with respect to horizontal, and sealing the opening.

16. The plating method according to claim 8, further comprising:

holding the substrate with a substrate holder such that the surface to be plated of the substrate is exposed;

bringing a cover into contact with the substrate holder so as to hermetically cover the substrate; and evacuating air from within the cover, wherein irradiating ultraviolet light onto the surface to be plated of the substrate occurs inside the cover; and hydrophilically treating the substrate surface includes bringing the pretreatment liquid into contact with the surface to be plated of the substrate inside the cover.

\* \* \* \* \*